(12) United States Patent
Matsuura

(10) Patent No.: US 8,021,896 B2
(45) Date of Patent: Sep. 20, 2011

(54) METHOD OF MANUFACTURING SEMICONDUCTOR DEVICE, METHOD OF MANUFACTURING SEMICONDUCTOR SUBSTRATE AND SEMICONDUCTOR SUBSTRATE

(75) Inventor: Osamu Matsuura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 751 days.

(21) Appl. No.: 12/068,916

(22) Filed: Feb. 13, 2008

(65) Prior Publication Data
US 2008/0191254 A1 Aug. 14, 2008

(30) Foreign Application Priority Data
Feb. 14, 2007 (JP) .................. 2007-033251

(51) Int. Cl.
*H01L 21/8246* (2006.01)
(52) U.S. Cl. .................. 438/3; 257/E21.664
(58) Field of Classification Search .......... 257/E21.663, 257/E21.664; 438/3
See application file for complete search history.

(56) References Cited

U.S. PATENT DOCUMENTS

| 6,709,875 | B2* | 3/2004 | Gilbert et al. ............ 438/3 |
| 7,390,678 | B2* | 6/2008 | Wang et al. ............. 438/3 |
| 2002/0137302 | A1* | 9/2002 | Shinohara ............ 438/400 |
| 2008/0001254 | A1* | 1/2008 | Wang ............. 257/532 |

FOREIGN PATENT DOCUMENTS
JP 10-12832 A 1/1998
* cited by examiner

*Primary Examiner* — Anh Phung
*Assistant Examiner* — Michael Lulis
(74) *Attorney, Agent, or Firm* — Westerman, Hattori, Daniels & Adrian, LLP

(57) ABSTRACT

A semiconductor substrate with an insulating film, a barrier layer containing a metal and formed over the insulating film in a region that includes a peripheral edge part of a semiconductor substrate, a capacitor lower electrode layer formed on the barrier layer and having an edge-cut on the peripheral edge part of the semiconductor substrate, an oxide layer formed on the barrier layer at the peripheral edge part where the barrier layer is not covered by the lower electrode layer, a ferroelectric layer formed on the lower electrode layer and the oxide layer, and a capacitor upper electrode layer formed over the ferroelectric layer.

8 Claims, 20 Drawing Sheets

METALLURGICAL MICROSCOPE

SEM

METALLURGICAL MICROSCOPE

SEM

METHOD OF MANUFACTURING SEMICONDUCTOR DEVICE, METHOD OF MANUFACTURING SEMICONDUCTOR SUBSTRATE AND SEMICONDUCTOR SUBSTRATE

CROSS-REFERENCE TO RELATED APPLICATIONS

This application is based upon and claims the benefit of priority from the prior Japanese Patent Application No. 2007-033251, filed on Feb. 14, 2007, the entire contents of which are incorporated herein by reference.

TECHNICAL FIELD

The present invention relates to a method of manufacturing semiconductor device, method of manufacturing semiconductor substrate and semiconductor substrate.

BACKGROUND

Volatile storage elements such as DRAM (Dynamic Random Access Memory) and SRAM (Static Random Access memory), and nonvolatile memory such as FLASH are used in a variety of fields.

However, memory which has the high speed, low voltage properties of DRAM and the nonvolatile properties of FLASH memory, such as FeRAM (Ferro-electric Random Access Memory), MRAM (Magnetoresisitive Random Access Memory) and PRAM (Phase change Random Access Memory), is currently being researched. Some of these memories are also in mass production.

FeRAM elements include ferroelectric capacitors constructed by sandwiching a ferroelectric layer between upper and lower electrodes on a substrate. FeRAM makes use of a hysteresis property in a relationship between a polarization charge and voltage in ferroelectric materials.

Ferroelectric capacitors may be classified into planar types and stack types according to a connection structure of the lower electrode and the transistor connection. In the planar type, wiring connected to an upper surface of the lower electrode electrically connects to either the source or drain of a transistor. In the stack type, a conductive plug connected to a lower surface of the lower electrode connects to either the source or drain of the transistor.

The stack-type ferroelectric capacitor is formed using a process shown in FIGS. 1A-1D. An example of such a process is disclosed in Japanese Patent Application Laid-Open No. HEI10-12832.

In FIG. 1A, a transistor tr used to form FeRAM is formed on a silicon substrate (silicon wafer) 101. The transistor tr includes a gate electrode 103 formed on the silicon substrate 101 with a gate insulating film 102 there between, source/drain impurity-diffused regions 104a and 104b formed in the silicon substrate 101 on both sides of the gate electrode 103, and an interlayer insulating film 105 formed on the gate electrode 103 and the source/drain impurity diffused regions 104a and 104b. Contact holes 106 are formed in the interlayer insulating film 105 on the source/drain impurity diffused regions 104a and 104b, and conductive plugs 107a and 107b composed of polysilicon are formed in the contact holes 106.

After forming a barrier metal layer 108, an Ir lower electrode layer 109, a TiOx seeding layer 110a, and a non-crystalline PZT layer 110b, a PZT crystalline layer 110 is formed by annealing the TiOx seeding layer 110a and the non-crystalline PZT layer 110b in an oxygen atmosphere, as shown in FIG. 1B.

Next, after forming an Ir upper electrode layer 111 on the PZT crystalline layer 110 as shown in FIG. 1C, a mask (not shown in the drawings) is formed on the Ir upper electrode layer 111 and etching is performed from the upper electrode layer 111 to the barrier metal layer 108. The arrangement remaining under the mask, composed of layers from the Ir upper electrode layer 111 to the barrier metal layer 108, forms a capacitor 112.

The barrier metal layer 108 formed under the Ir lower electrode layer 109 is formed to prevent the conductive plugs 107a and 107b from reacting with the Ir lower electrode layer 108, and is composed of a material such as TiN, $RuO_2$, TiAlN. TiAlN has excellent oxygen resistance and functions as a thin film oxygen barrier layer.

After forming a multitude of FeRAMs on a substantially circular silicon wafer, the silicon wafer is divided to form chips.

The lower electrode layer 109 in the FeRAM is prevented from forming on a peripheral edge part of the silicon wafer 101 by using a shadow ring (not shown in the drawings), as shown in FIG. 2A. Moreover, the Ir lower electrode layer 109 is formed more thinly on the peripheral edge part of the silicon wafer 101, and in some cases, is removed by etching to prevent film peeling at the peripheral edge part.

As a result, the Ir lower electrode layer 109 is absent from the peripheral edge part of the silicon wafer 101, and, when a TiAlN layer is formed as the barrier metal, the PZT crystalline layer 110 contacts the barrier metal layer 108 at the peripheral edge part of the silicon wafer 101, as shown in FIG. 2B.

However, adhesion of the PZT crystalline layer 110 to the TiAlN barrier metal layer 108 is poor, and portions of the PZT crystalline layer 110 tend to lift or peel. This is considered to be a result of expansion caused by a reaction between the TiAlN barrier metal layer 108 and Pb in the PZT crystalline layer 110 which occurs at a crystallization temperature of the PZT crystalline layer 110.

The PZT crystalline layer 110 peeling from the peripheral edge part of the silicon wafer 101 in this way may cause contamination in subsequent processes, resulting in deterioration in semiconductor element yield rate.

SUMMARY

The semiconductor substrate and the method of manufacturing the semiconductor substrate according to the present invention provide a semiconductor wafer having an edge region at which a barrier layer is not in contact with a dielectric layer.

DETAILED DESCRIPTION OF THE EMBODIMENTS

Figure 1A:
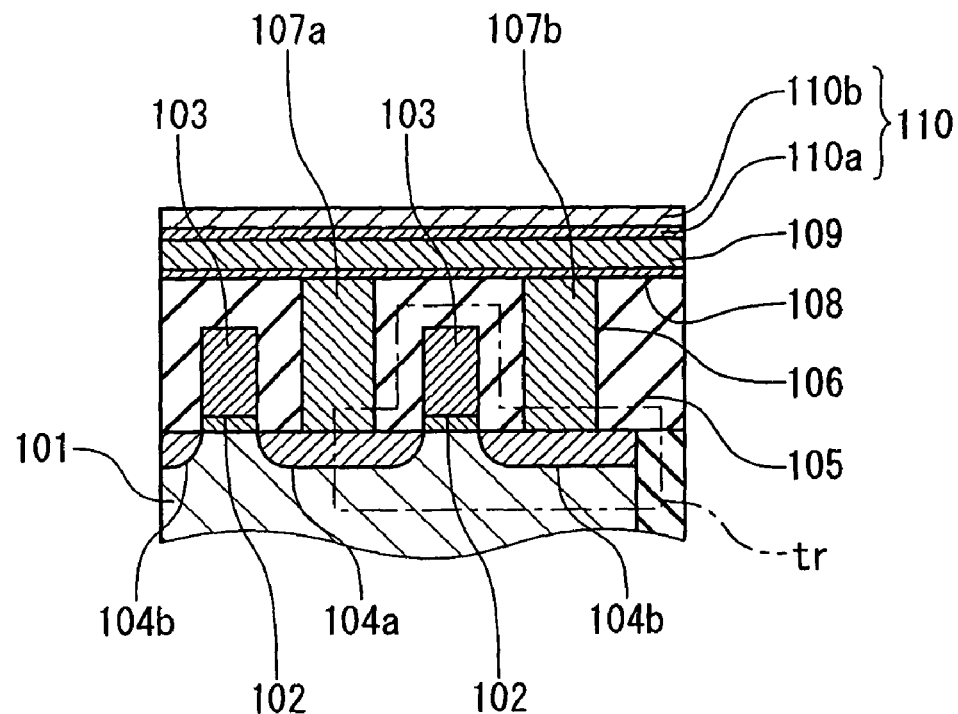
FIGS. 1A to 1D are cross-sectional views shown a manufacturing process of a semiconductor substrate.
Figure 1B:
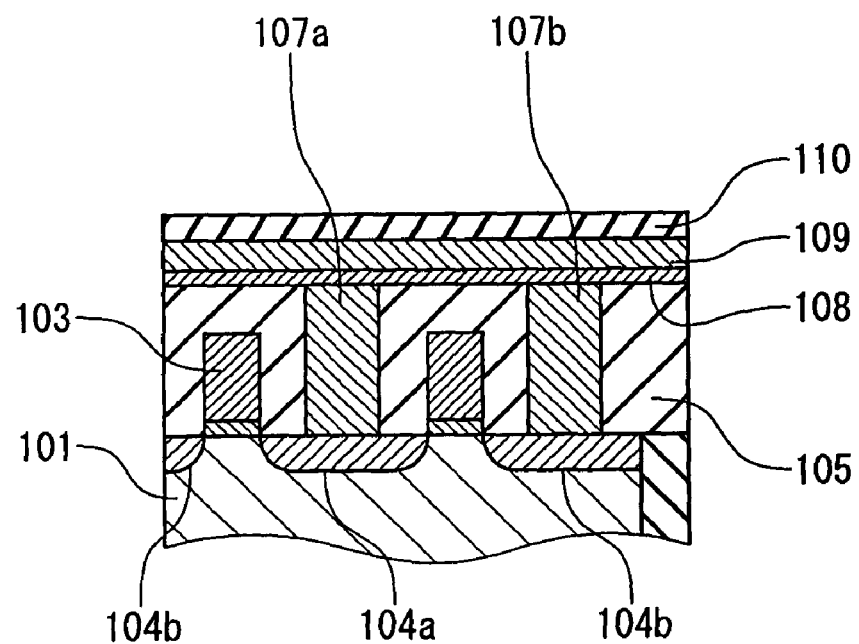
Figure 1C:
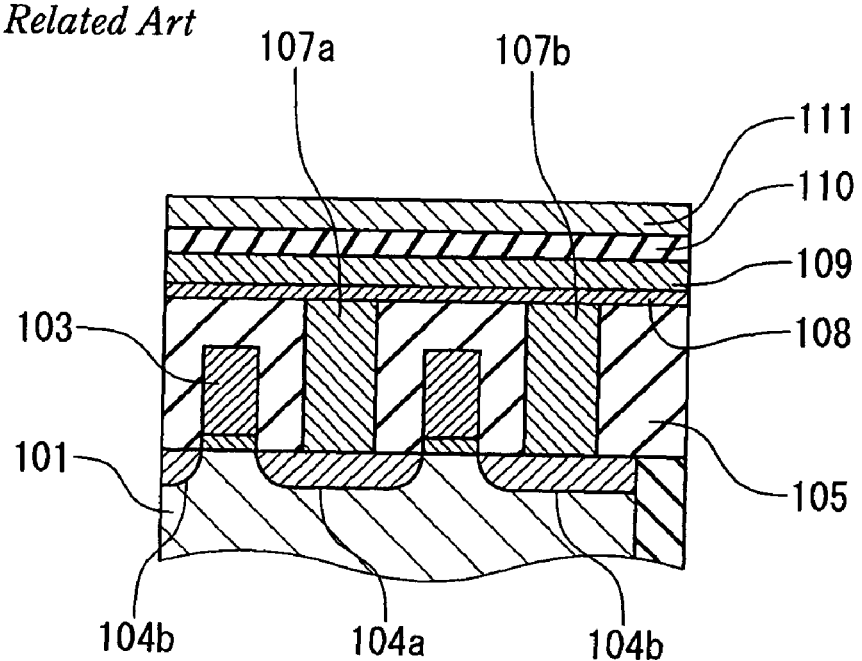
Figure 1D:
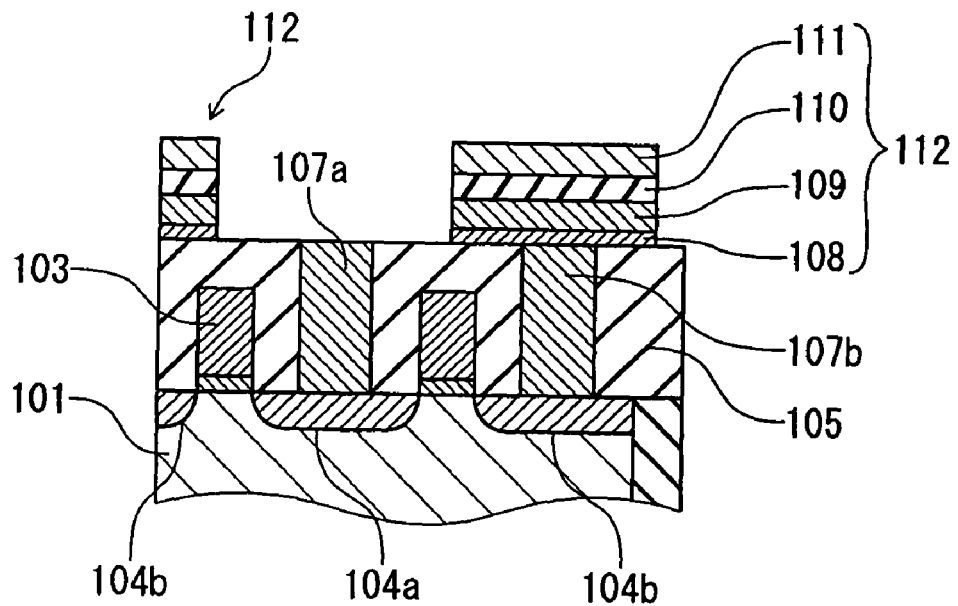
Figure 2A:
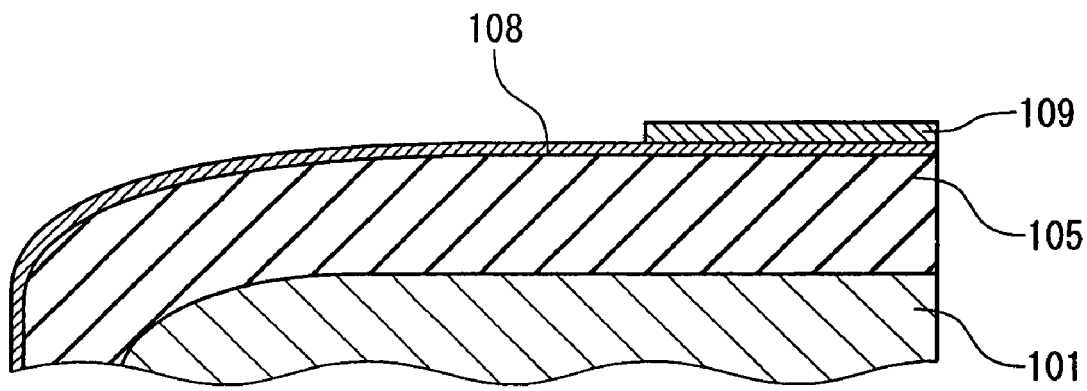
FIGS. 2A and 2B are cross-sectional views showing a peripheral edge part of a silicon wafer in the manufacturing process of the semiconductor substrate of FIGS. 1A-1D.
Figure 2B:
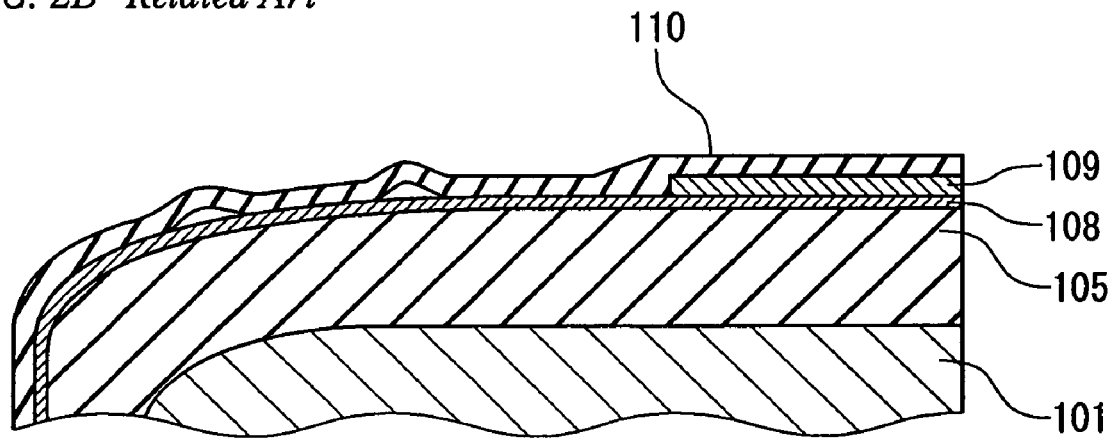
Figure 3A:
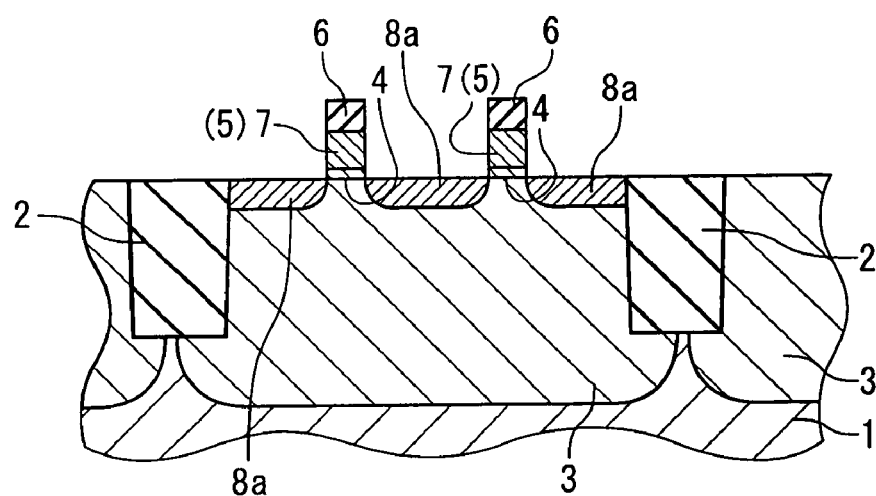
FIGS. 3A to 3M are cross-sectional views showing a manufacturing process of a semiconductor substrate relating to an embodiment of the present invention.

The semiconductor substrate such as silicon wafer forming process up to the process for forming memory cell transistors on one side thereof is described with reference to FIGS. 3A-3B. As shown in FIG. 3A, shallow trench isolation 2 (STI) composed of silicon dioxide embedded in grooves in an element separation area are formed in a silicon substrate (silicon wafer) 1. Note that an element insulating film formed using a LOCOS method may be substituted in place of the shallow trench isolation 2.

In addition, a P-well with implanted boron ions or the like is formed in a transistor forming region that is surrounded by the shallow isolation trench 2 on the silicon substrate 1. Although not shown in the drawings, an N-well formed by implanting arsenic ions, phosphorus ions or the like also exists in the silicon substrate 1.

Next, a gate insulating film 4 composed of a silicon oxide film is formed in the transistor forming region by oxidizing a surface of the silicon substrate 1 using a thermal oxidization method. A polycrystalline silicon film 5 and a silicon nitride film 6 are then formed on the gate insulating film 4 using a method such as a CVD (Chemical Vapor Deposition). The polycrystalline silicon film 5 is conductive as a result of being doped with impurities.

Next, a gate electrode 7 is formed from the polycrystalline silicon film 5 whose upper surface is covered with the silicon nitride layer 6 by patterning the silicon nitride film 6 and the polycrystalline silicon film 5. Note that two gates separated by a gap are formed on one P-well 3.

Next, with the gate electrode 7 and the silicon nitride film 6 masked, n-type impurity diffused regions 8a are formed on both sides of the gate electrode 7 by implanting an n-type dopant such arsenic or phosphorus ions into the P-well 3.

Figure 3B:
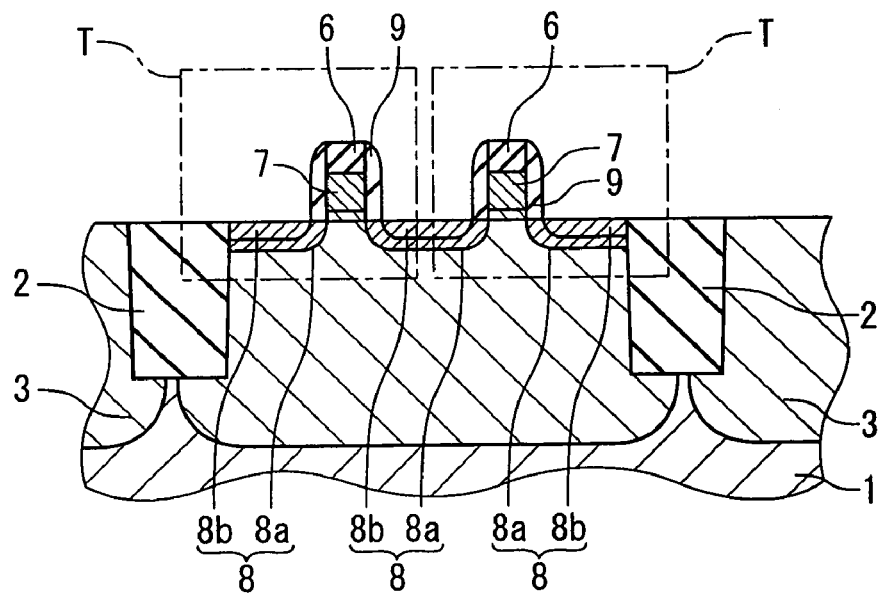

A silicon nitride film is formed by a method such as CVD, and the silicon nitride film is then etched to leave a side wall insulating film 9 on the gate electrode 7 and the silicon nitride film 7, as shown in FIG. 3B.

Next, with the gate electrode 7 and the side wall insulating film 9 as a mask, n-type dopant ions are implanted into the silicon substrate 1 to form shallow n-type impurity diffused regions 8b in the P-well 3 on both sides of the gate electrode 10. A source/drain region 8 is thereby formed from the n-type impurity diffusion regions 8a and 8b with an LDD structure.

The above-described process forms a memory cell transistor T having the gate electrode 7 and the source/drain region 8. The following describes a process for forming a plug on the source/drain region 8, with reference to FIG. 3C.

First, a silicon nitride film 11 at a thickness of 20 nm and a silicon oxide film 12 at a thickness of 700 nm are formed as a first interlayer insulating film 13 on the silicon substrate 1 including the memory cell transistor T, using a plasma CVD method. A gas such as silane ($SiH_4$) or TEOS (tetra-ethoxysilane) may be used as a source gas for the silicon oxide film 12. A surface of the silicon oxide film 12 is then flattened using a Chemical Mechanical Polishing (CMP) method.

Three contact holes reaching corresponding three portions of the source/drain region 8 in the P-well 3 are formed in the first interlayer insulating film 13 by patterning the first interlayer insulating film by means of photolithography using a photoresist and dry etching.

A titanium (Ti) film at a thickness of 20 nm, a titanium nitride (TiN) at a thickness for 10 nm, and a tungsten (W) film at a thickness of 300 nm or similar films are formed in the stated order within the contact holes 14 and over an entire surface of the first interlayer insulating layer 13. The Ti film, and the TiN film are formed by a method such as sputtering or CVD, and the W film is formed by CVD using tungsten hexafluoride ($WF_6$).

First, plugs 15 with an embedded W/TiN/Ti layer structure are formed in the contact holes by polishing, using a CMP method, the tungsten film, the titanium nitride film and the titanium film until an upper surface of the first interlayer insulating layer 13 is exposed.

The following describes a process for forming the ferroelectric capacitor. A Ti layer at a thickness of 20 nm is formed on the first interlayer insulating layer 13 by sputtering, and is then heated by Rapid Thermal Annealing (RTA) in a nitrogenous ($N_2$) atmosphere to form a TiN layer 16, as shown in FIG. 3D. The TiN layer 16 is formed to improve orientation of crystals being formed on the TiN layer 16.

Next, an oxygen barrier layer 17 composed to TiAlN is formed on the TiN layer 16 at a thickness of 100 nm by sputtering. An Ir lower electrode layer 18 is then formed at a thickness of 100 nm by sputtering. Note that the oxygen barrier layer 17 is a composed of a nitride or a material that contains a metal.

Figure 4A:
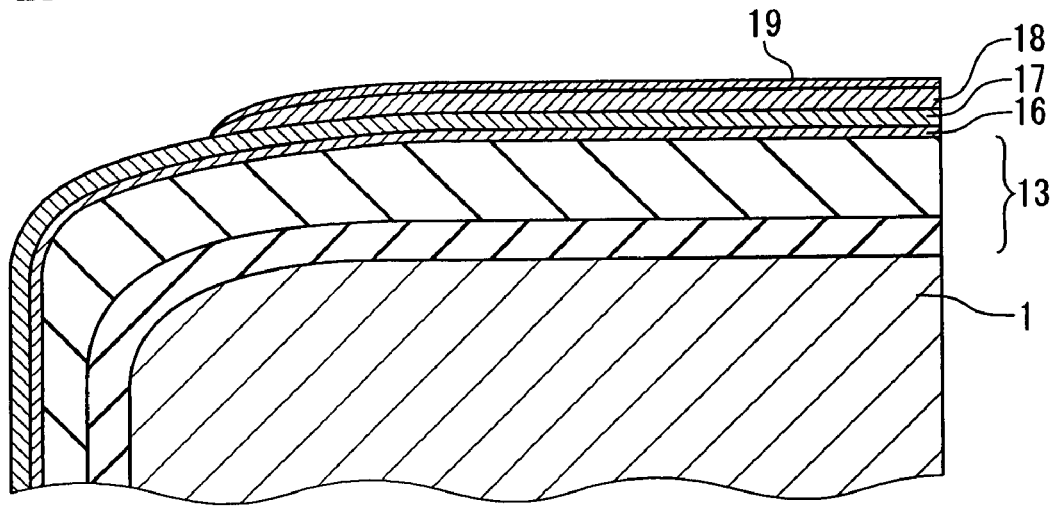
FIGS. 4A to 4F are cross-sectional views showing the peripheral edge part of the silicon wafer in the manufacturing process of the semiconductor substrate relating to an embodiment of the present invention.

As shown in FIG. 4A, the TiN layer 16, the TiAlN oxygen barrier layer 17, and the lower electrode layer 18 are formed in the stated order at a peripheral edge part 1a of the silicon wafer 1 where FeRAM devices are not formed.

When forming the lower electrode layer 18, a shadow ring (not shown in the drawings) is positioned over a peripheral edge part 1a of the silicon wafer 1 to give an edge-cut in the lower electrode layer 18 on the peripheral edge part 1a.

Thus, on the peripheral edge part 1a which extends 4 mm or less, 3.5 mm for instance, from the peripheral edge of the silicon wafer 1 towards the center, the lower electrode layer 18 is formed under conditions which produce a layer that is thinner than the layer produced on an inner region of the wafer.

In the case that the thinly formed lower electrode layer 18 on the peripheral edge part 1a peels easily compared to the inner region of the wafer, the peripheral edge part 1a may be removed. The process to remove the peripheral edge part is as follows.

Figure 3C:
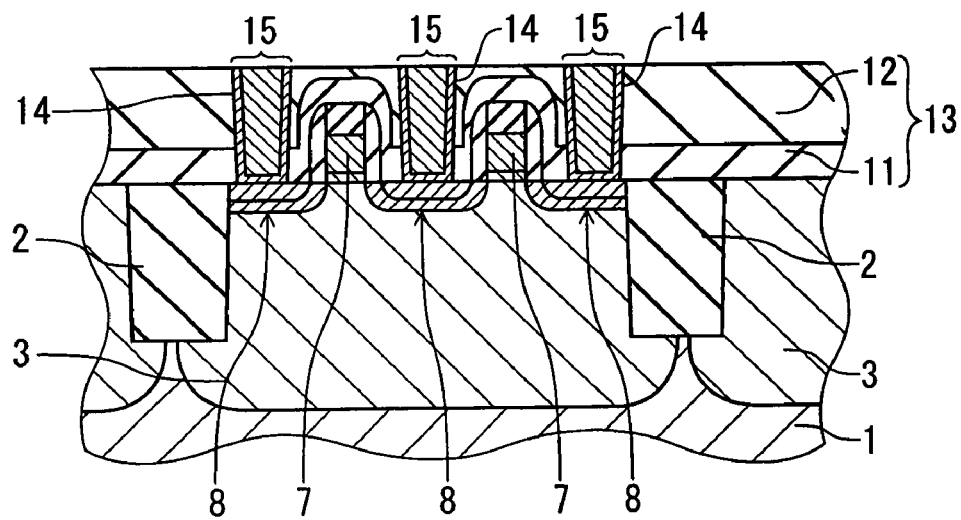
Figure 3D:
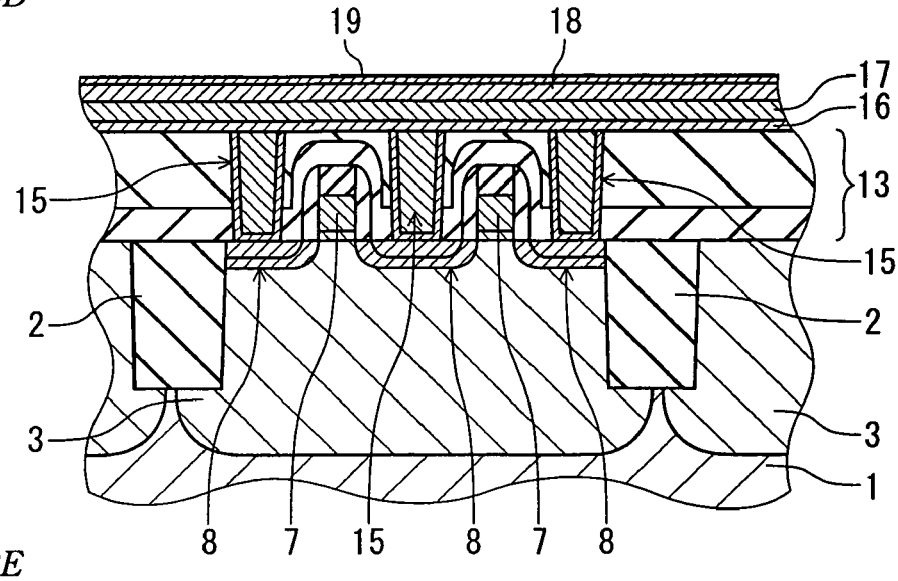
Figure 4B:
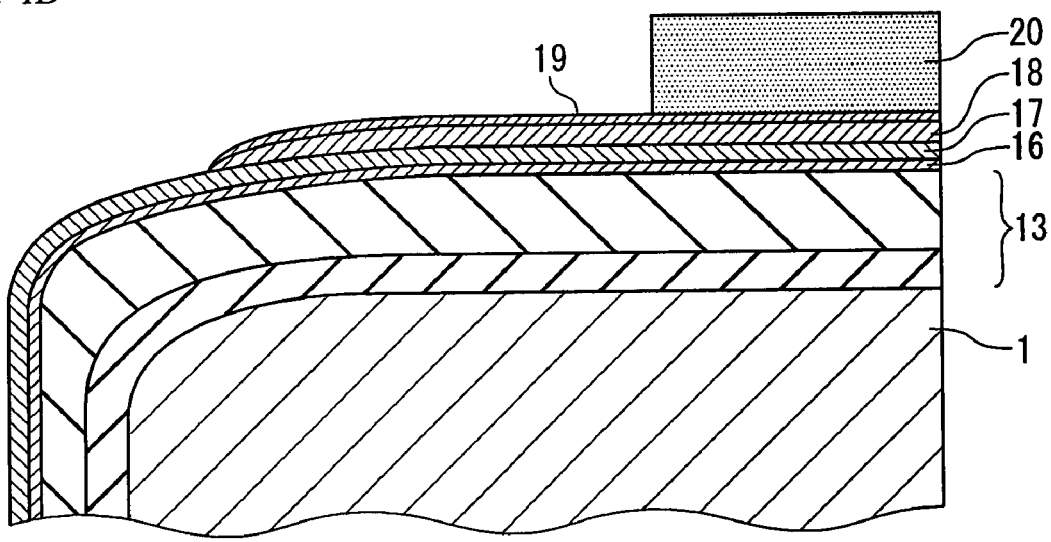

After forming the lower electrode layer 18 an alumina layer ($Al_2O_3$) 19 is formed thereon at a thickness of 20 nm by sputtering, as shown in FIG. 3D and FIG. 4A. A resist is applied to the alumina layer 19, and the arrangement is then exposed and developed to form a resist pattern 20 which exposes the alumina layer 19 present on the peripheral edge part 1a of the silicon wafer 1, as shown in FIG. 4B.

With the resist pattern 20 masked, the alumina layer 19 present on the peripheral edge part 1a is then removed by etching. Next, with the partially etched alumina layer 19 on the peripheral edge part 1a as a hard mask, the lower electrode layer 18 on the peripheral edge part la and not covered by the hard mask is removed by reactive ion etching (RIE). For this process a gas containing chlorine is introduced into a low pressure chamber of an RIE device.

Figure 4C:
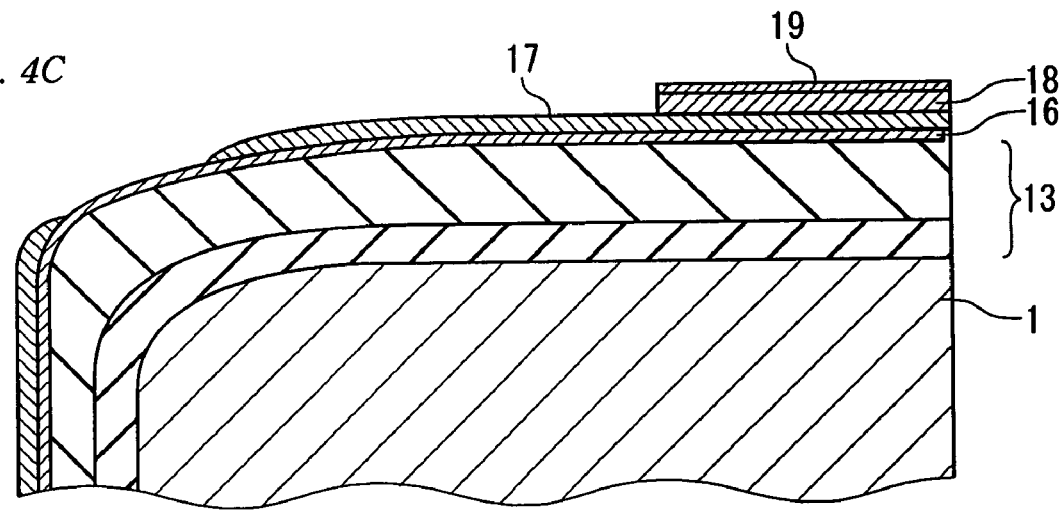

As a result of this process, the TiAlN oxygen barrier layer 17 is exposed at the peripheral edge part 1a of the silicon wafer 1, as shown in FIG. 4C. Note that if the lower electrode layer 18 has an extremely thin portion on the peripheral edge part 1a, the TiAlN oxygen barrier layer 17 may be etched away to expose part of the TiN layer 16. The resist pattern 20, which has completed patterning, is removed after the etching.

Note that when there is no risk of peeling at the edge-cut of the lower electrode layer 18 on the peripheral edge part 1a, the etching process may be omitted, in which case the arrangement is in the state shown in FIG. 4C from the beginning and may not pass through the state shown in FIG. 4A.

Figure 4D:
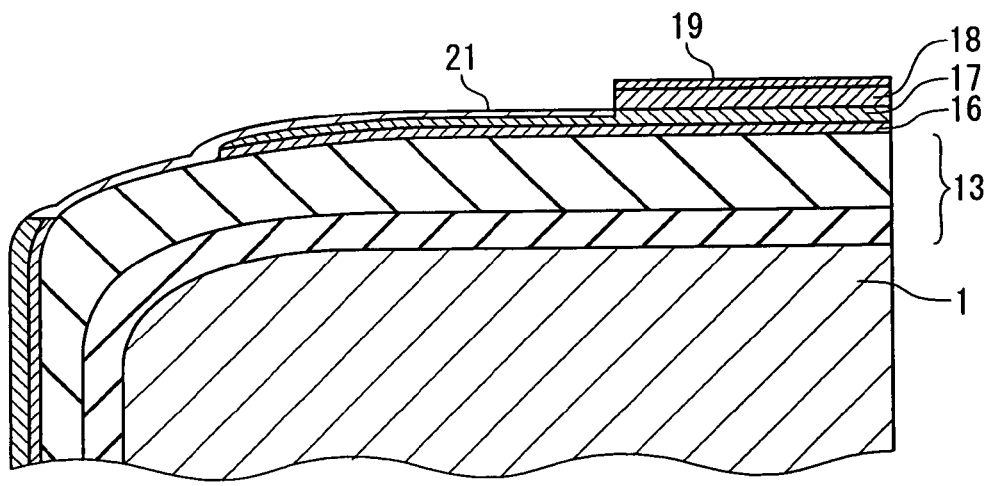

Next, the TiAlN barrier layer 17 exposed on the peripheral edge part 1a is, for instance, treated in an oxygenous atmosphere at 550 deg C. As a result, the elements Ti and Al at the surface of the TiAlN oxygen barrier layer 17 each bond with oxygen to form an oxide layer 21, as shown in FIG. 4D. On the peripheral edge part 1a of the silicon wafer 1, the TiAlN oxygen barrier layer 17 may be partially exposed. However, the Ti composing the Ti layer then bonds with the oxygen so that the oxide layer 21 is formed at the exposed section.

In the oxidization processing, since the alumina layer 19 prevents oxidization of the Ir layer that forms the lower electrode layer 18, deterioration in the crystal orientation in the lower electrode layer 18 is prevented.

Figure 4E:
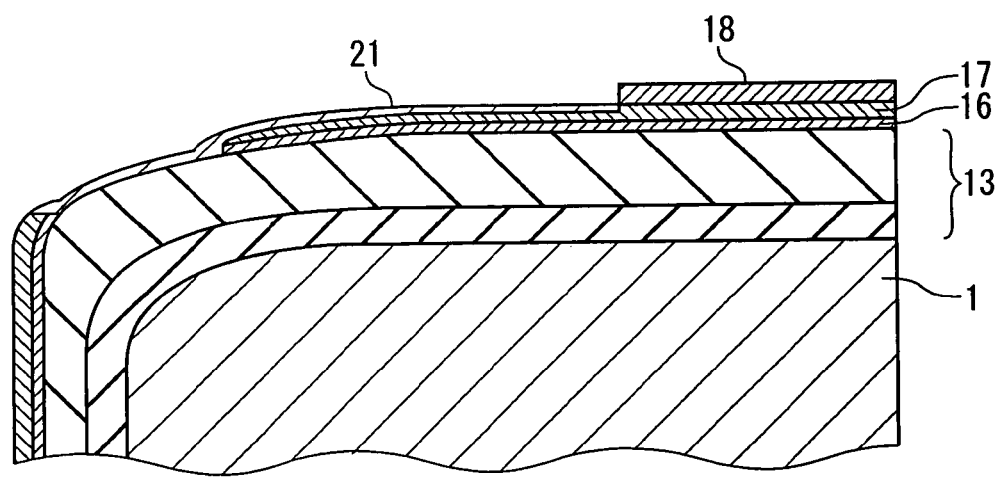

Next the alumina layer 19 is removed, as shown in FIG. 4E, by etching with the oxide layer 21 on the peripheral edge part 1a of the silicon wafer 1 covered by photoresist (not shown in the drawings). Here a reactive ion etching method (RIE) is used as the etching method with, for instance, a $C_4F_8$, $O_2$, and Ar gas mixture introduced to the reduced pressure chamber of the RIE device as the etching gas.

Note that the alumina layer 19 may be removed to leave an oxide layer 21 including titanium and aluminum, using a weak hydrofluoric acid solution. In this case, the peripheral edge part 1a of the silicon wafer 1 may not be covered with photoresist. When the photo resist is removed, the oxide layer 21 is exposed on the peripheral edge part 1a of the silicon wafer 1, and the lower electrode layer 18 is exposed in the wafer region inside the peripheral edge part 1a.

Figure 3E:
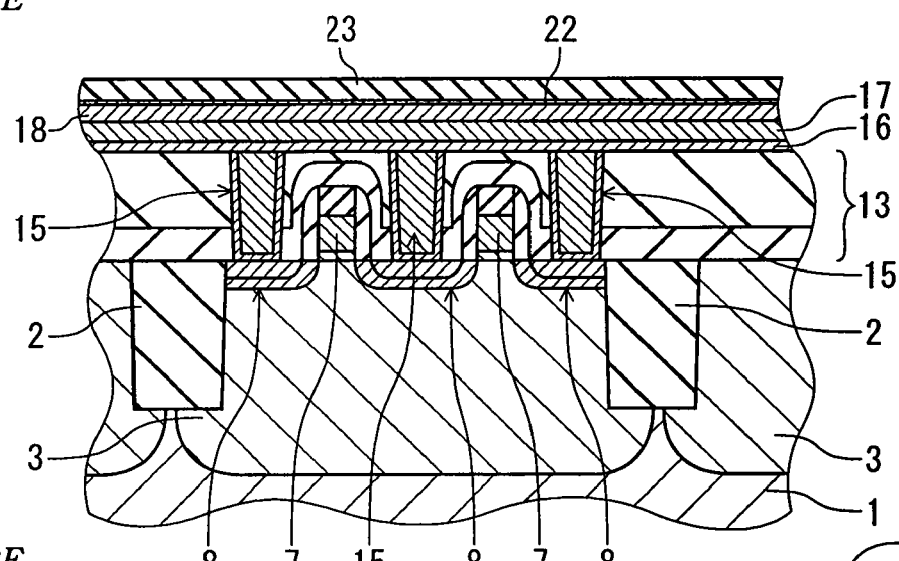
Figure 4F:
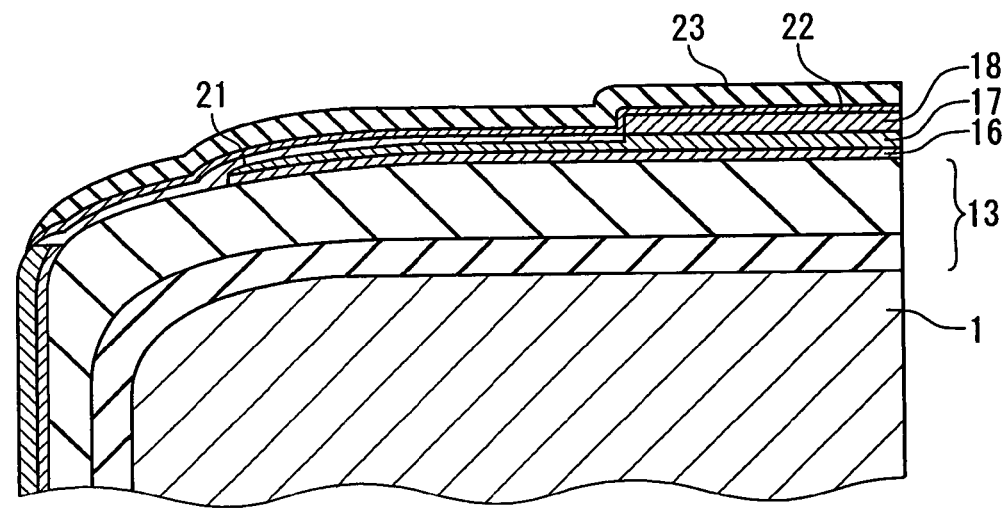

After forming a first PZT layer 22 including Pb (Zr, Ti) $O_3$ ferroelectric material at a thickness of 5 nm on the lower electrode layer 18 and the oxide layer 21 using a Metal Organic Chemical Vapor Deposition (MOCVD) method, a second PZT layer 23 including Pb (Zr, Ti) $O_3$ ferroelectric material is formed at a thickness of 115 nm on the first PZT layer 22 using the MOCVD method, as shown in FIG. 3E and FIG. 4F. In the MOCVD method, a substrate temperature may be set to 620 deg C. and the pressure of the forming atmosphere set to approximately 666 Pa. The first and second PZT layers 22 and 23 are ferroelectric layers.

Figure 3F:
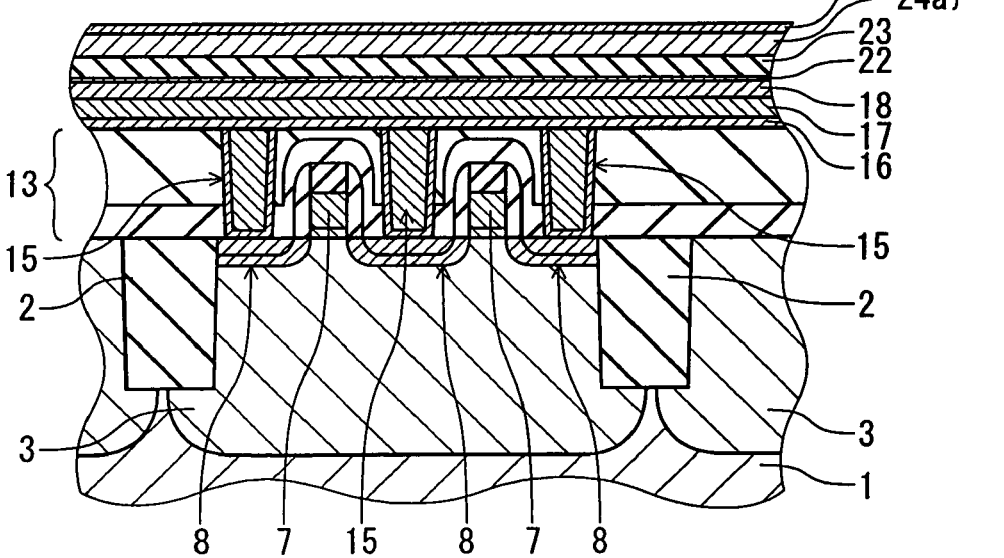

With this arrangement, at the peripheral edge part 1a of the silicon wafer 1, the first PZT layer 22 is formed directly on the oxide layer 21, and the second PZT layer 23 is formed on the first PZT layer 22, as shown in FIG. 4F. Next, an $IrO_2$ layer 24a at a thickness of 150 nm and an Ir layer 24b at a thickness of 50 nm are formed in the stated order on the second PZT layer 23 by sputtering, as shown in FIG. 3F. The $IrO_2$ layer 24a and IrO layer 24b form an upper electrode layer 24.

Recovery annealing is then performed to eliminate the damage caused to the crystals of the PZT layers 22 and 23 when forming the upper electrode layer 24. For the recovery annealing, a method by which the silicon wafer 1 is put in an annealing oven and heated for 60 minutes in a 550 deg C. atmosphere at atmospheric pressure while introducing oxygen may be used.

Figure 3G:
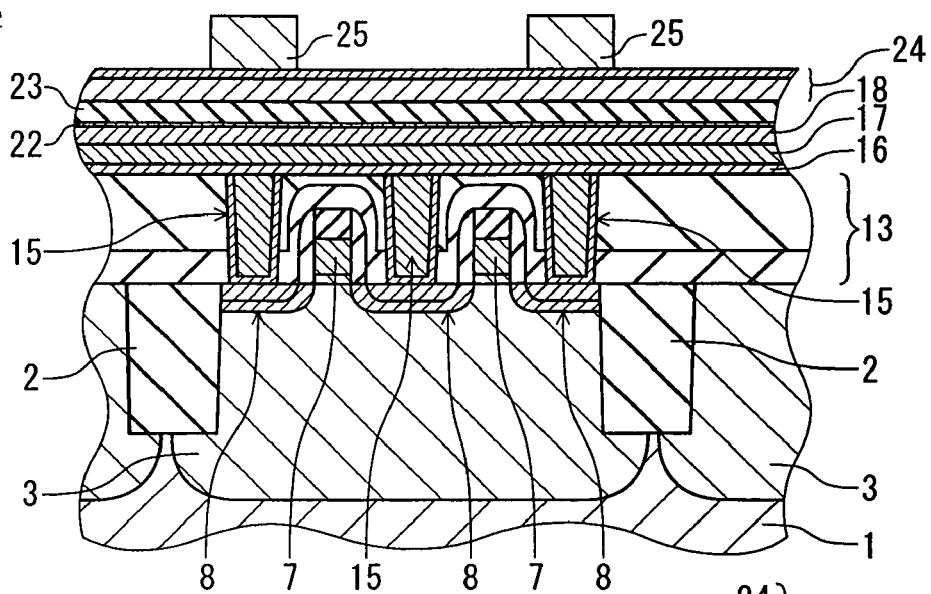

Next, a mask 25 is formed in a ferroelectric capacitor region on the upper electrode layer 24, as shown in FIG. 3G. The ferroelectric capacitor region includes regions corresponding to the outer two of the three first plugs 15 in the P-well 3 and fringes thereof. The mask 25 is, for instance, a Ti layer and silicon dioxide layer patterned to form a hard film.

Where not covered by the mask, the upper electrode layer 24, the PZT layers 22 and 23, the lower electrode layer 18, the TiAlN oxygen barrier layer 17 and the TiN layer 16 are etched away. A plasma etching method may be used to perform this etching. In this plasma etching, a gas mixture of HBr, $O_2$, and $CF_4$ is used as the etching gas.

Figure 3H:
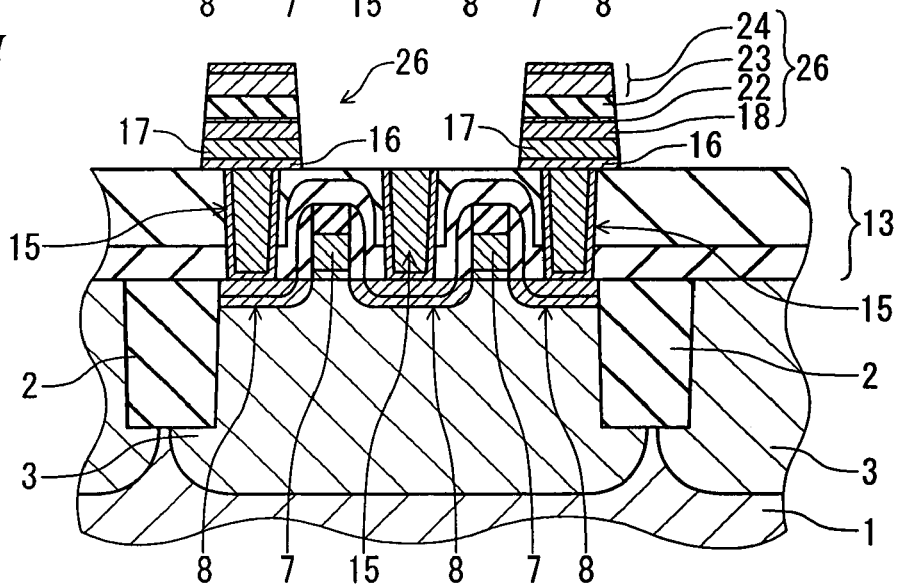

As a result of this process, the patterned upper electrode 24, the PZT layers 22 and 23, and the lower electrode layer 18 form a ferroelectric capacitor 26, as shown in FIG. 3H. In this arrangement, the lower electrode layer 18 electrically contacts the source/drain region 8 via the patterned TiAlN oxygen barrier layer 17 and TiN layer 16, and the first plug 15.

Note that the upper electrode layer 24, the PZT layers 22 and 23, the lower electrode layer 18, the TiAlN oxygen barrier layer 17, and the TiN layer 16 on the peripheral edge part la may be etched away or allowed to remain.

Figure 3I:
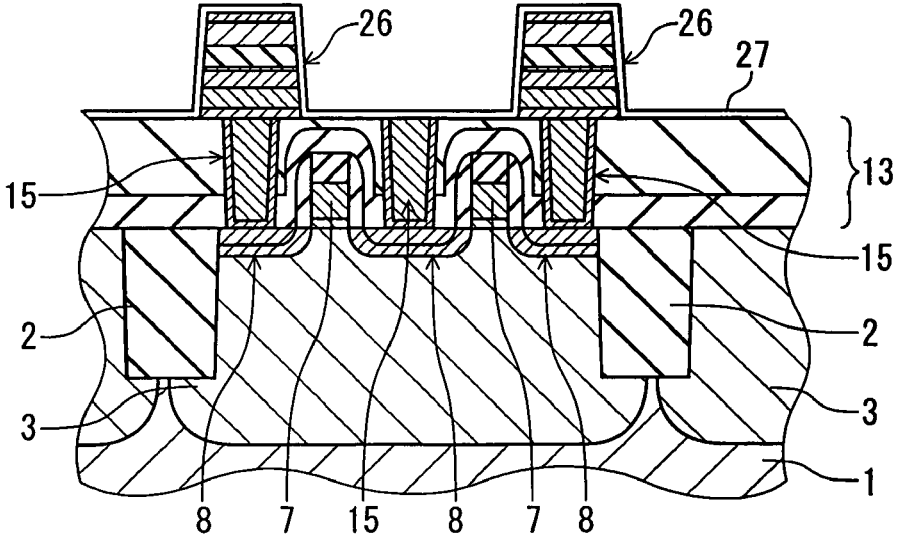

A capacitor protecting film 27 is then formed so as to cover an entire surface of the first interlayer insulating layer 13 and the ferroelectric capacitor 26, using a sputtering method or the like as shown in FIG. 3I. The capacitor protecting film 27 is an alumina layer, a PZT layer or the like formed at a thickness of approximately 40 nm.

Figure 3J:
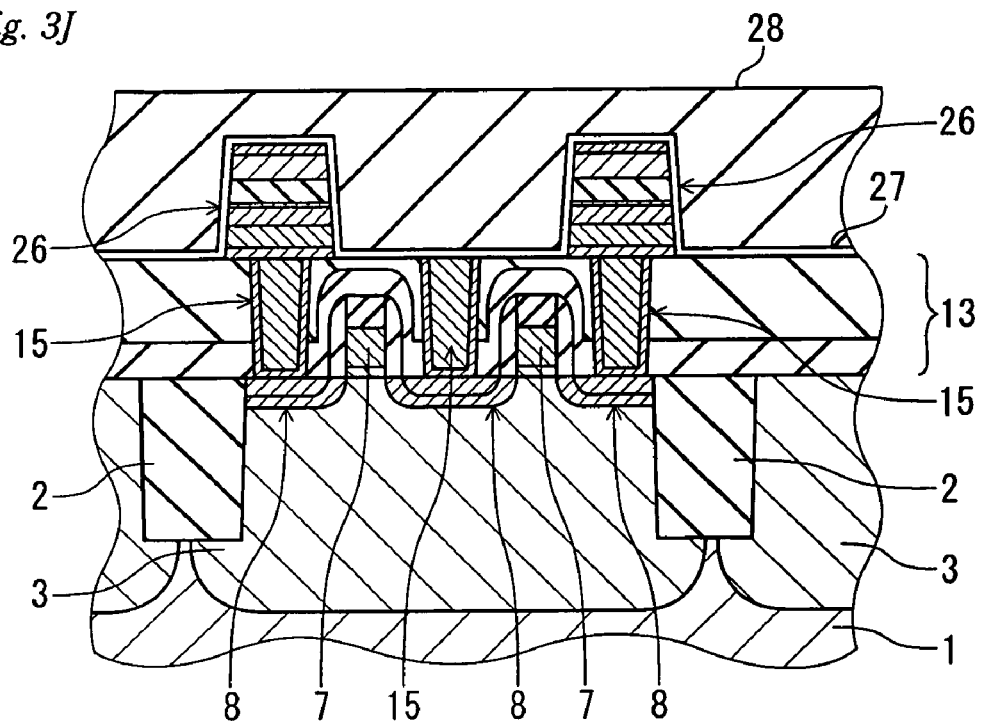

Next, a second interlayer insulating film 28 composed of silicon oxide at a thickness of 11500 nm is formed on the capacitor protecting film 27 by High Density Plasma (HDP) CVD using a gas mixture of $SiH_4$, $O_2$, and Ar, as shown in FIG. 3J. The surface of the second interlayer insulating film 28 is then flattened using a CMP method. In the flattening process polishing conditions are set so that the thickness of the second interlayer insulating film 28 on the ferroelectric capacitor reaches a thickness of approximately 300 nm.

Figure 3K:
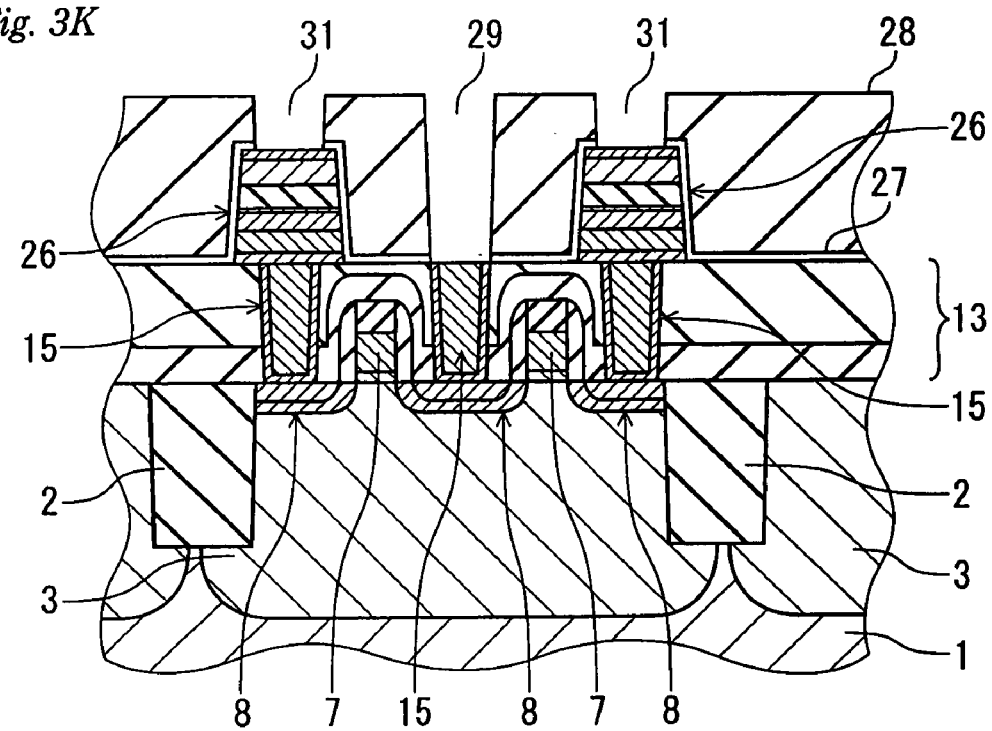

Next, a resist pattern (not shown in the drawings) is formed on the second interlayer insulating film 28, and a first via hole 29 and second via holes 31 are formed by partial etching over the first plug 15 at the center of the P-well 3 and the ferroelectric capacitors respectively, as shown in FIG. 3K. A Ti layer at a thickness of 30 nm, a TiN layer at a thickness of 20 nm, and a W layer at a thickness of 300 nm are formed in the stated order in the first via hole 29 and the second via holes 31 and on the second interlayer insulating film 28.

Figure 3L:
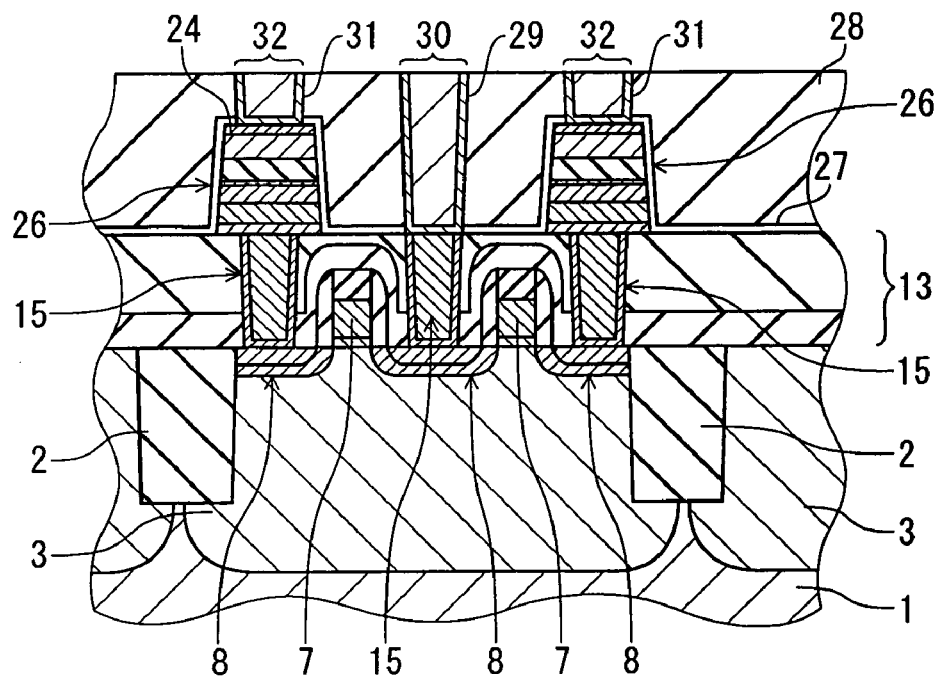

The W layer, the TiN layer, and the Ti layer are polished using a CMP method until a surface of the second interlayer insulating film 28 is exposed, leaving a second plug 30 and third plugs 32 with a W/TiN/Ti structure in the first via hole 29 and the second via holes 31, as shown in FIG. 3L.

Next, a Ti layer at a thickness of 60 nm, a TiN layer at a thickness of 30 nm, an aluminum-copper layer (AlCu) at a thickness of 400 nm, a Ti layer at a thickness of 5 nm and a TiN layer at a thickness of 70 nm, or similar layers, are formed in the stated order on the second interlayer insulating film 28.

Figure 3M:
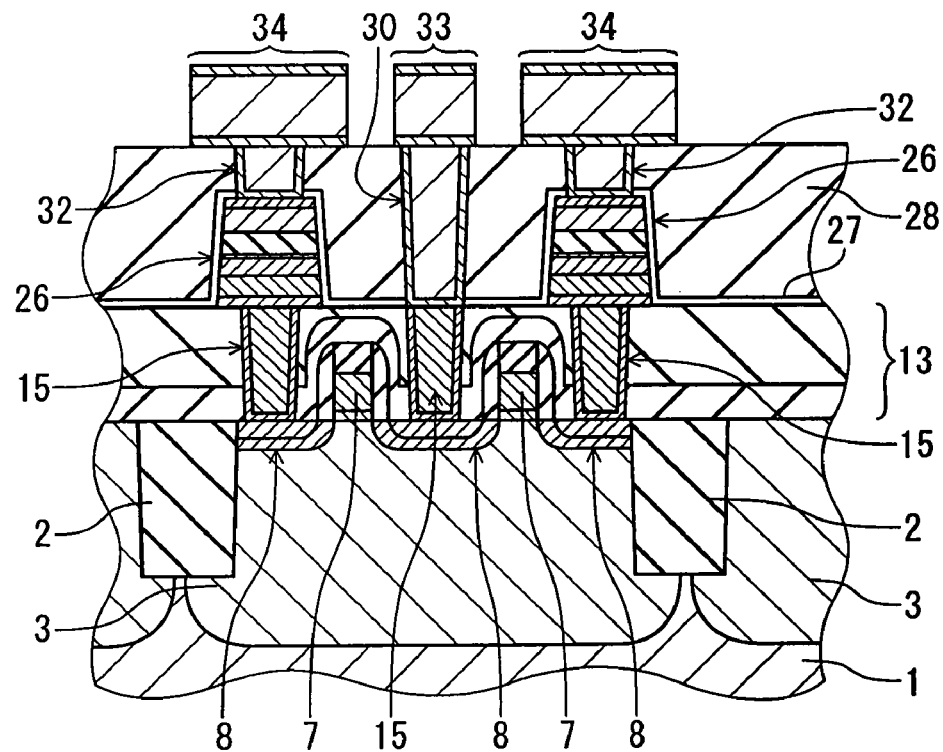

Patterning the conductive layers on the second interlayer insulating film 28 forms a first wire 33 electrically connected to the source/drain impurity diffused region 8 via the first plug 15 at the center of the P-well and the second plug 30 above the first plug 15, a second wire 34 electrically connected to the upper electrode layer 24 on the ferroelectric capacitor 26 via the third plug 32 as shown in FIG. 3M, and other wiring (not shown in the drawings). Thereafter, multilayer wiring is formed, and the silicon wafer 1 is divided along scribe lines to form a plurality of FeRAM.

In this way, a 1T1C-type ferroelectric memory having two capacitors 26 and two transistors T is formed in a single cell region. As described above, when the PZT layers 22 and 23 are formed, the TiAlN oxygen barrier 17 on the peripheral edge part 1a of the silicon wafer 1 has been exposed by removing the Ir lower electrode layer 18 using a method such as etching.

The oxide layer 21 formed by oxidization processing of the exposed surface of the TiAlN oxygen barrier layer 17 prevents the PZT layers 22 and 23 formed from contacting the TiAlN oxygen barrier layer 17. Moreover, the oxide layer 21 is formed by oxidizing the elements which make up the TiAlN oxygen barrier layer 17, and therefore adheres favorably to the TiAlN oxygen barrier layer 17 and to the PZT layers 22 and 23 which also contain oxygen.

As a result, the PZT layers 22 and 23 do not peel from the peripheral edge part 1a of the silicon wafer 1 where the lower electrode layer 18 has been removed and hence wafer contamination caused by film peeling is prevented.

Figure 5A:
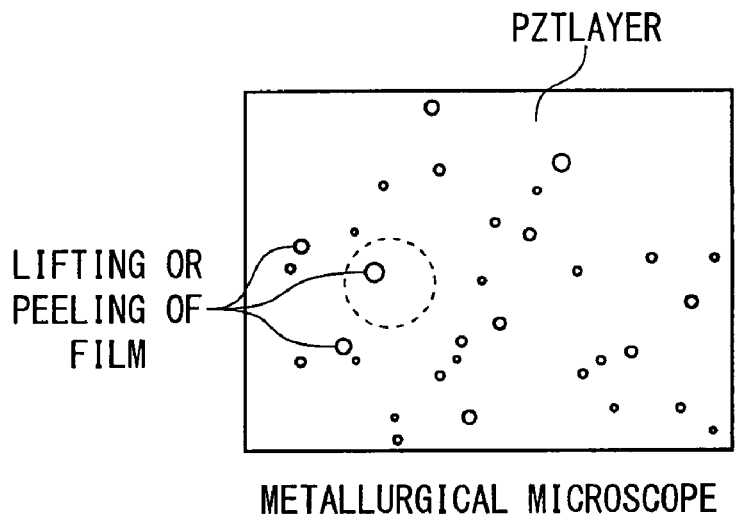
FIGS. 5A and 5B are based on a photograph taken by a metallurgical microscope such as an SEM and show a plurality of layers at the peripheral edge part of a silicon wafer from a reference example relating to the present invention.
Figure 5B:
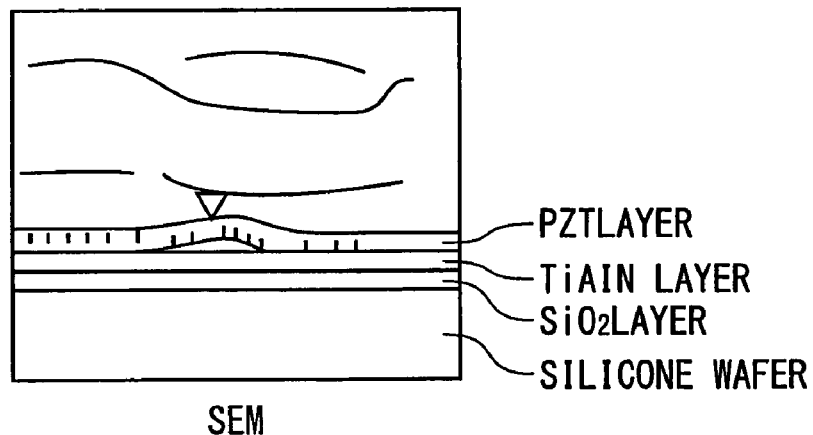

In the reference example relating to the present invention, peeling and lifting occurred in the PZT layer, as shown in FIGS. 5A and 5B, when the PZT layer was formed directly on the TiAlN layer. FIG. 5A is a plan view based on a photograph of the top surface of the PZT layer taken with a metallurgical microscope, and the large circular portions indicate areas where lifting or peeling of the film has occurred. FIG. 5B is based on a SEM photograph of the portion surrounded by a broken line in FIG. 5A, and the point marked with a triangle indicates where lifting or peeling of the film has occurred.

Figure 6A:
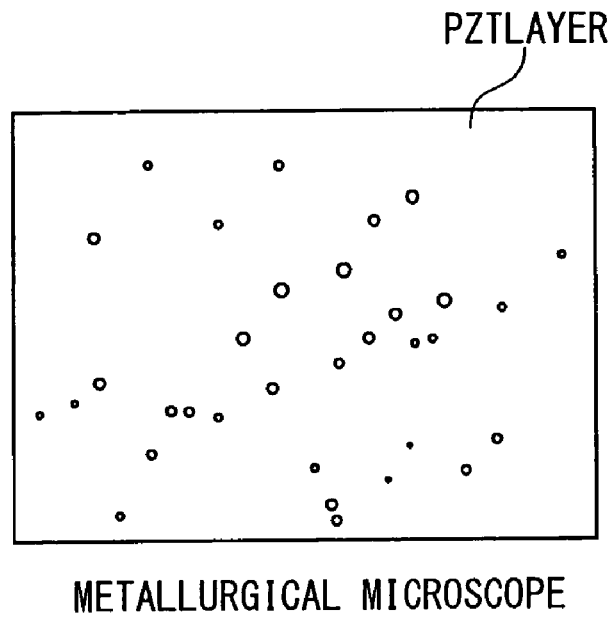
FIGS. 6A and 6B are based on a photograph taken by a metallurgical microscope such as an SEM and show a plurality of layers at the peripheral edge part of the silicon wafer relating to an embodiment of the present invention.
Figure 6B:
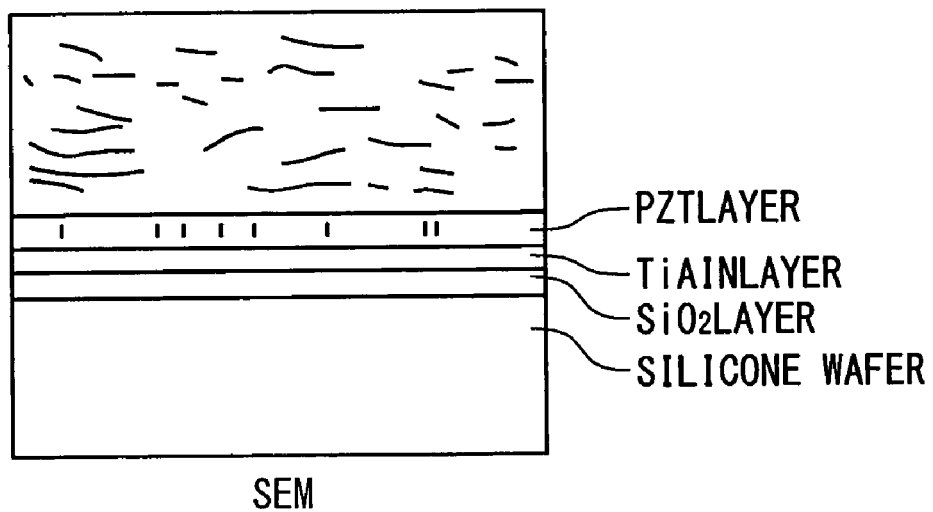

Contrastingly, when the surface of the TiAlN layer is oxidized to form a thin oxide layer and the PZT layers are formed thereon, as in the embodiment of the present invention, peeling and lifting does not occur in the PZT layers, as shown in FIG. 6A and FIG. 6B. FIG. 6A is based on a metallurgical microscope photograph of the surface of the PZT layers, and shows some unevenness in the film, indicated by the small circles, but no lifting or peeling of the film. FIG. 6B is based on a SEM photograph, and shows some unevenness at the surface of the PZT film but no lifting or peeling. Note that due to extreme thinness, the oxide layer formed on the surface of the TiAlN layer cannot be seen in the SEM photograph.

The following describes a manufacturing process for a semiconductor substrate relating to a second embodiment of the present invention.

The transistor T is formed on the silicon substrate 1, the first interlayer insulating layer 13 is formed covering the transistor T, and the first plugs 15 connecting to the source/drain impurity diffusion region 8 are formed in the first interlayer insulating layer 13, using processes which are substantially the same as those shown in FIG. 3A to FIG. 3C.

Figure 7A:
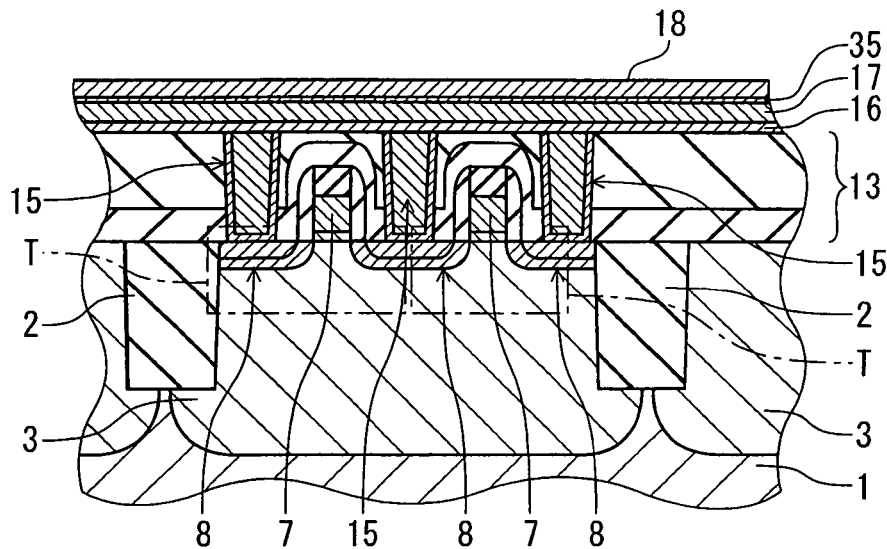
FIGS. 7A to 7E are cross-sectional views showing a manufacturing process of a semiconductor substrate relating to a second embodiment of the present invention.

Next, as shown in FIG. 7A, the TiN layer 16 and the TiAlN oxygen barrier layer 17 are formed on the first interlayer insulating layer 13.

Next, an oxide layer 35 composed of an alumina layer, a titanium oxide layer, a titanium-aluminum oxide layer, or the like is formed at a thickness of approximately 10 nm by sputtering. An Ir lower electrode layer 18 is then formed at a thickness of 100 nm by sputtering. Due to the extreme thinness of the oxide layer 35, it is possible for charges to pass between the lower electrode layer 18 and the TiAlN oxygen barrier layer by tunneling through the oxide layer 35.

Figure 8A:
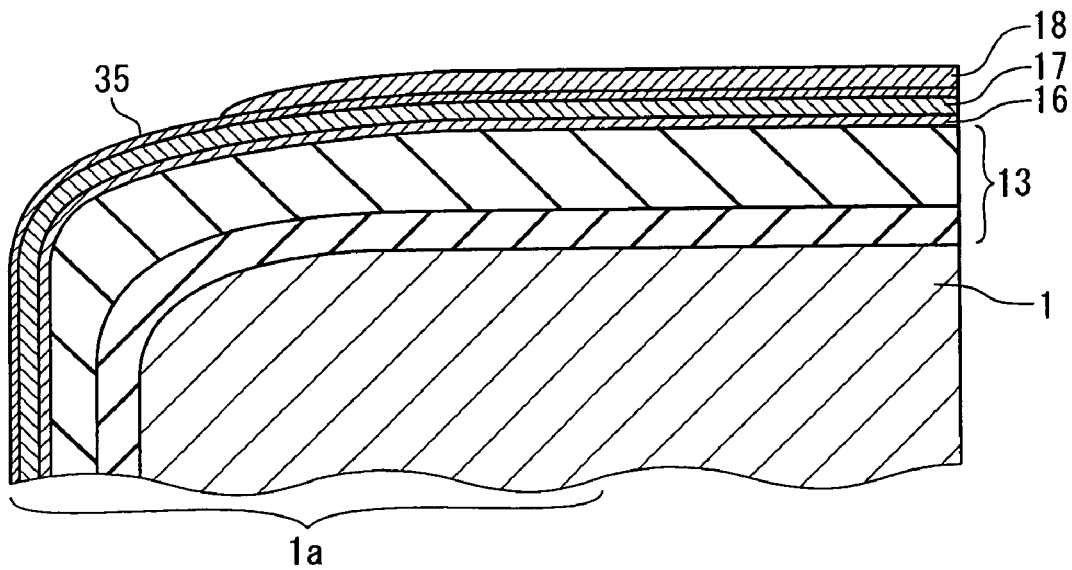
FIGS. 8A to 8C are cross-sectional views showing a peripheral edge part of the manufacturing process of the semiconductor substrate relating to the second embodiment of the present invention.

In this state, the peripheral edge part 1a of the silicon wafer 1, where FeRAM are not formed, has the TiN layer 16, the TiAlN oxygen barrier layer 17, the oxide layer 35, and the lower electrode layer 18 layered in the stated order, as shown in FIG. 8A. An edge-cut is generated in the lower electrode layer 18 on the peripheral edge part about 4 mm inward of the peripheral edge of the silicon wafer 1.

If the lower electrode layer 18 on the peripheral edge part 1a has a thickness distribution for which peeling is likely, the lower electrode layer 18 may be removed from the peripheral edge part 1a. To achieve this, RIE using a photoresist pattern (not shown in the drawings) may be used to remove the lower electrode layer 18 from the peripheral edge part 1a. When RIE is used, a gas containing chlorine is introduced as the etching gas into the low pressure chamber of the RIE device.

Figure 8B:
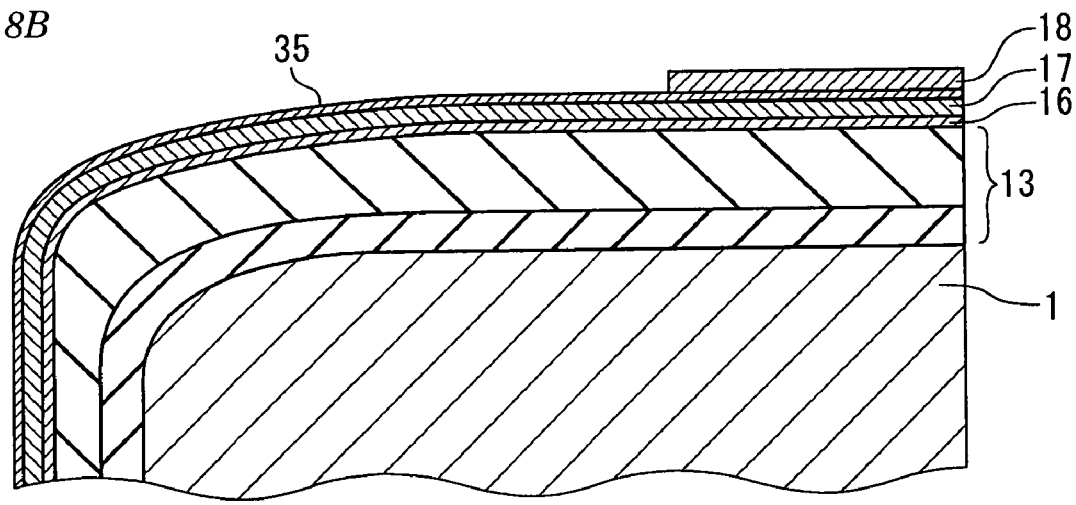

Note that when there is no risk of the edge-cut lower electrode layer 18 peeling from the peripheral edge part 1a, etching of the lower electrode layer 18 is not performed. As a result of the etching, the oxide layer 35 under the lower electrode layer 18 on the peripheral edge part 1a of the silicon wafer 1 is in an exposed state, as shown in FIG. 8B.

Figure 7B:
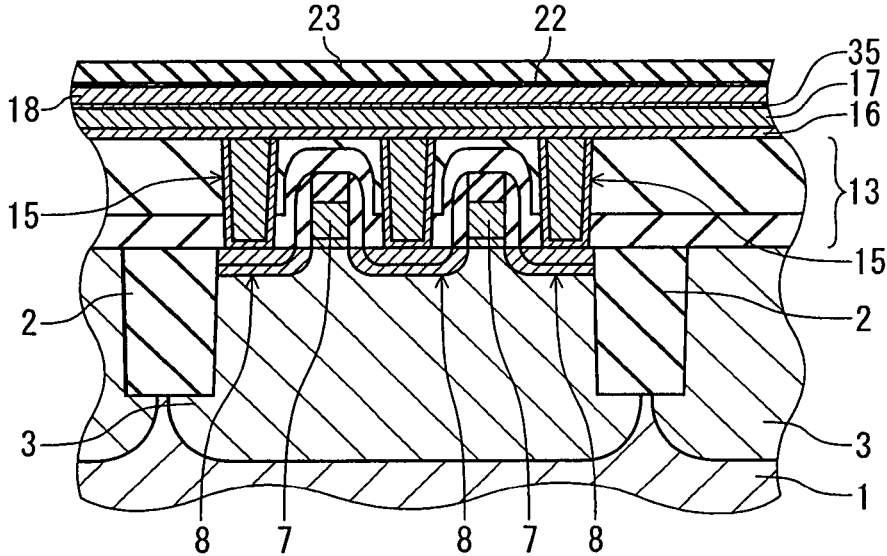
Figure 8C:
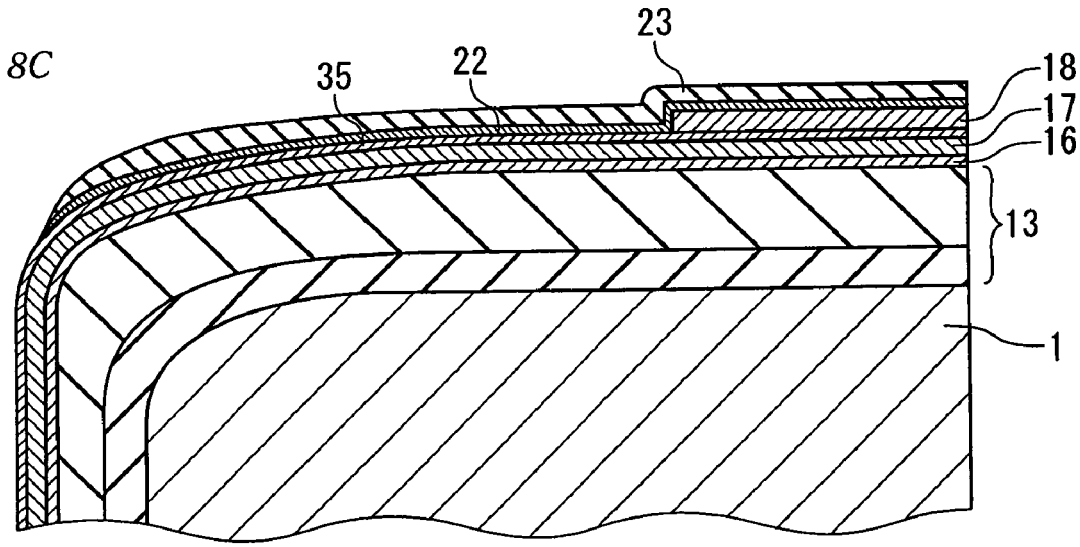

Next, as shown in FIG. 7B, the PZT layers 22 and 23 composed of Pb (Zr, Ti) are formed to cover the lower electrode layer 18 and the oxide layer 35. With this arrangement, the first PZT layer 22 is formed directly on the oxide layer 21 at the peripheral edge part 1a of the silicon wafer 1, and the second PZT layer 23 is formed on the first PZT layer 22, as shown in FIG. 8C.

Figure 7C:
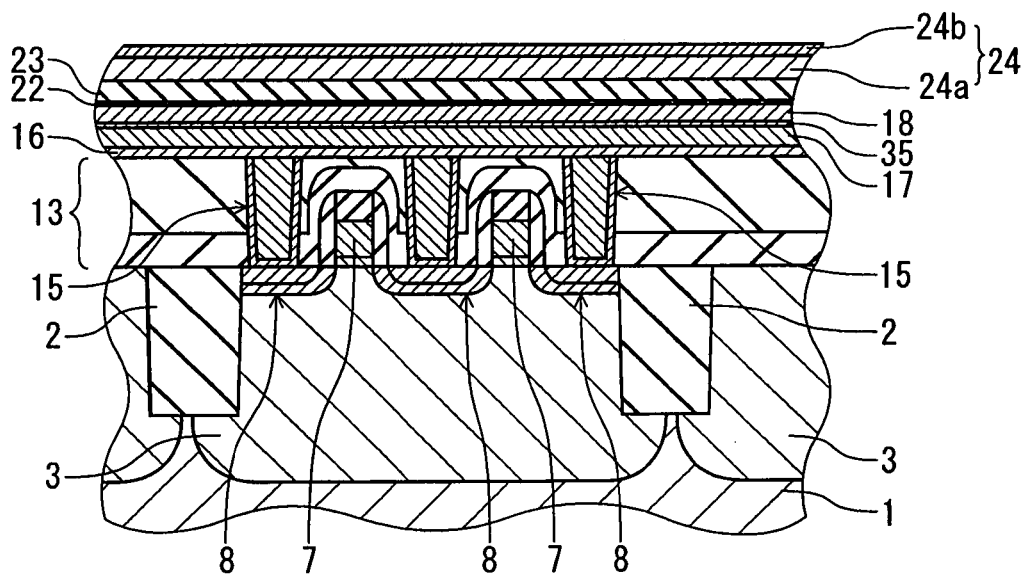

Next, an $IrO_2$ layer 24a and an Ir layer 24b are formed in the stated order on the second PZT layer 23. Together, the layers 24a and 24b form the upper electrode layer 24 shown in FIG. 7C.

Figure 7D:
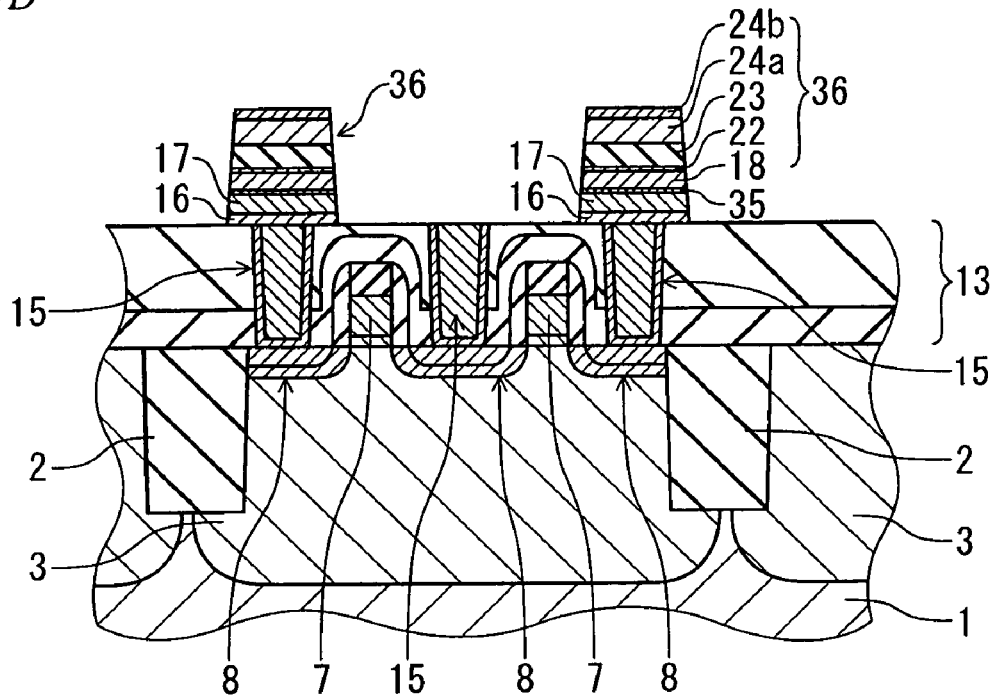

Recovery annealing is then performed to eliminate the damage to the crystals of the PZT layers 22 and 23 caused by forming the upper electrode layer 24. Next, the upper electrode 24, the PZT layers 22 and 23, the lower electrode 18, the oxide layer 35, the TiAlN oxygen barrier layer 17, and the TiN layer 16 are patterned to form a ferroelectric capacitor 36 of the type shown in FIG. 7D. In this arrangement, the lower electrode layer 18 electrically connects to the source drain impurity infused region 8 on both sides of the P-well 3 via the oxide layer 35, the TiAlN oxygen barrier layer 17, the TiN layer 16, and the first plug 15.

Note that the upper electrode layer 24, the PZT layers 22 and 23, the lower electrode layer 18, the oxide layer 35, the TiAlN oxygen barrier layer 17 and the TiN layer 16 formed on the peripheral edge part 1a of the silicon wafer 1 may be etched away or allowed to remain.

Figure 7E:
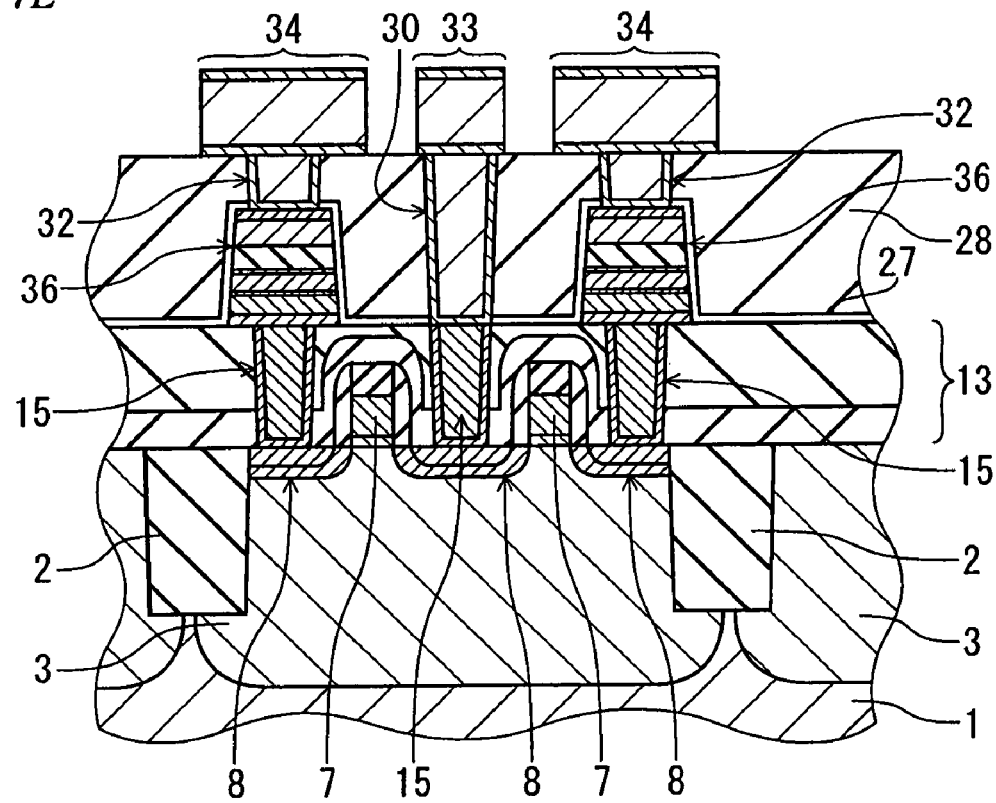

Next, the capacitor protecting film 27, which is an alumina layer, a PZT layer or the like and covers the entire surface of the ferroelectric capacitor 36 and the first interlayer insulating layer 13 and the second interlayer insulating film 28 which covers the capacitor protecting film 27 are formed, as shown in FIG. 7E. After flattening the surface of the second interlayer insulating film 28 using a CMP method, the first via hole 29 and the second via holes 31 are formed over the first plug 15 in the center of the P-well 3 and over the ferroelectric capacitors 36, by partially etching the second interlayer insulating film 28 and the capacitor protecting film 27.

The second plug 30 and the third plugs 32 are then formed in the first via hole 29 and in the second via holes 31 using a method substantially the same as that used in the first embodiment. The first wire 33 electrically connected to the source/drain impurity diffused region 8 via the first plug 15 at the center of the P-well 3 and the second plug 30 above the first plug 15, the second wire 34 electrically connected to the upper electrode layer 24 on the ferroelectric capacitor 36 via the third plug 32, and other wiring (not shown in the drawings) are then formed. Thereafter, multilayer wiring is formed, and the silicon wafer 1 is divided along scribe lines to form a plurality of FeRAM.

As described above, in the second embodiment of the present invention, the entire surface of the TiAlN oxygen barrier layer 17 included on the peripheral edge part 1a of the silicon wafer 1 is covered using an oxide layer 35 composed of alumina, titanium oxide, aluminum-titanium oxide or the like, and a lower electrode 18 is formed with an edge-cut to expose the oxide layer on the peripheral edge part 1a.

As a result, the oxide layer 35 prevents the PZT layers 22 and 23 from contacting the TiAlN oxygen barrier layer 17. Moreover, the oxide layer 35 adheres favorably to the TiAlN oxygen barrier layer 17 and to the PZT layers 22 and 23. Note also that the adhesiveness of the oxide layer 35 to the TiAlN oxygen barrier layer 17 is further improved by selecting, as the oxide for the oxide layer 35, a material that includes oxides of the elements in the TiAlN oxygen barrier layer 17, such as aluminum oxide or titanium oxide.

As a result, the PZT layers 22 and 23 do not peel from where the lower electrode layer 18 has been removed at the peripheral edge part 1a of the silicon wafer 1, and wafer contamination caused by film peeling is prevented.

Figure 9A:
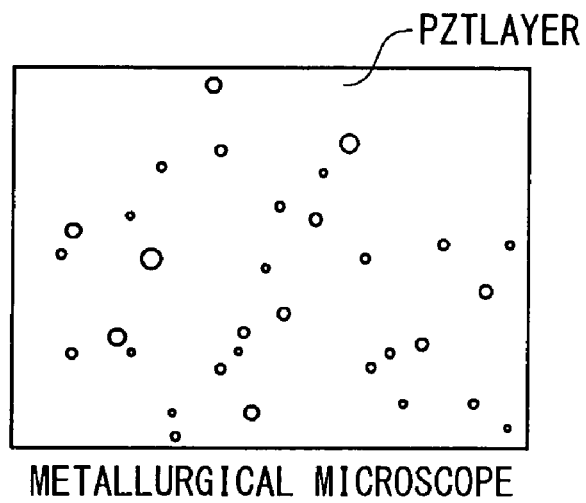
FIGS. 9A and 9B are based on a photograph taken by an SEM and shows a plurality of layers at the peripheral edge part of the silicon wafer relating to the second embodiment of the present invention.
Figure 9B:
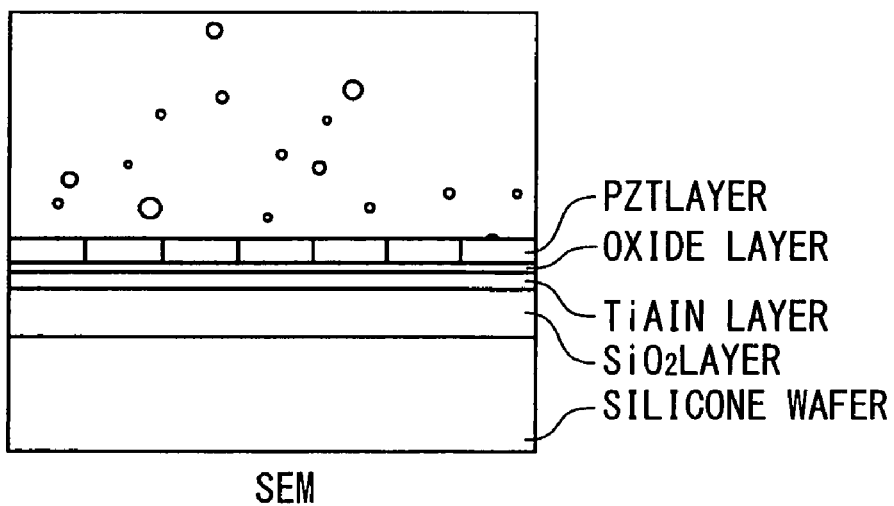

When the surface of the TiAlN layer is oxidized to form a thin oxide layer and the PZT layers are formed thereon, as in the second embodiment of the present invention, peeling and lifting did not occur in the PZT layers, as shown in FIG. 9A and FIG. 9B. FIG. 9A is based on a metallurgical microscope photograph of the surface of the PZT layer, and the surface to be very flat. FIG. 9B is based on a SEM photograph, and shows that the surface of the PZT is flat with no lifting or peeling.

The following describes a manufacturing process for a semiconductor substrate relating to a third embodiment of the present invention.

The transistor T is formed on the silicon substrate 1, the first interlayer insulating layer 13 is formed covering the transistor T and first plugs 15 connecting to the source/drain impurity diffusion region 8 are formed in the first interlayer insulating layer 13, using processes which are substantially the same as those shown in FIG. 3A to FIG. 3C.

Figure 10A:
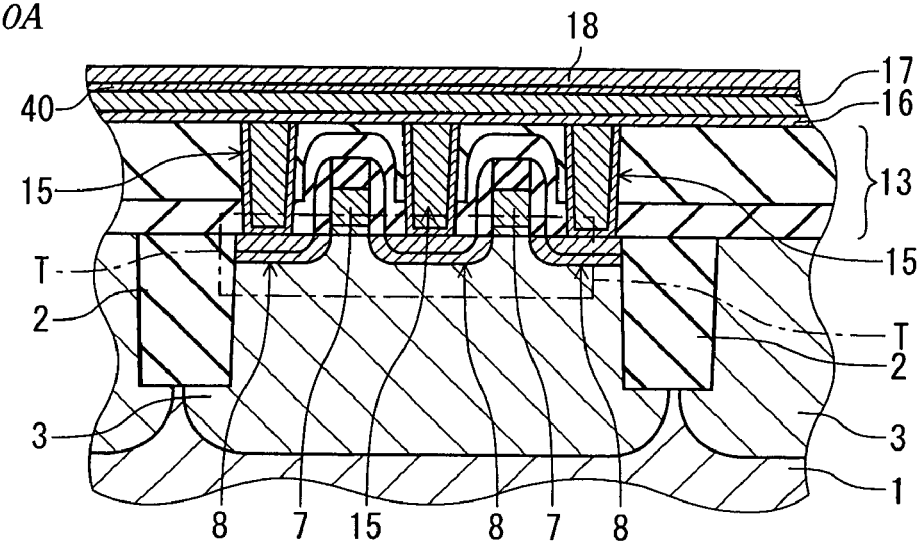
FIGS. 10A to 10E are cross-sectional views showing a manufacturing process of a semiconductor substrate relating to a third embodiment of the present invention.

Next, as shown in FIG. 10A, the TiN layer 16 and the TiAlN oxygen barrier layer 17 are formed on the first interlayer insulating layer 13. Next a metal layer 40 composed of an aluminum layer, a titanium layer, a titanium-aluminum layer, or the like is formed at a thickness of approximately 20 nm by sputtering. An Ir lower electrode layer 18 is then formed at a thickness of 100 nm by sputtering.

Figure 11A:
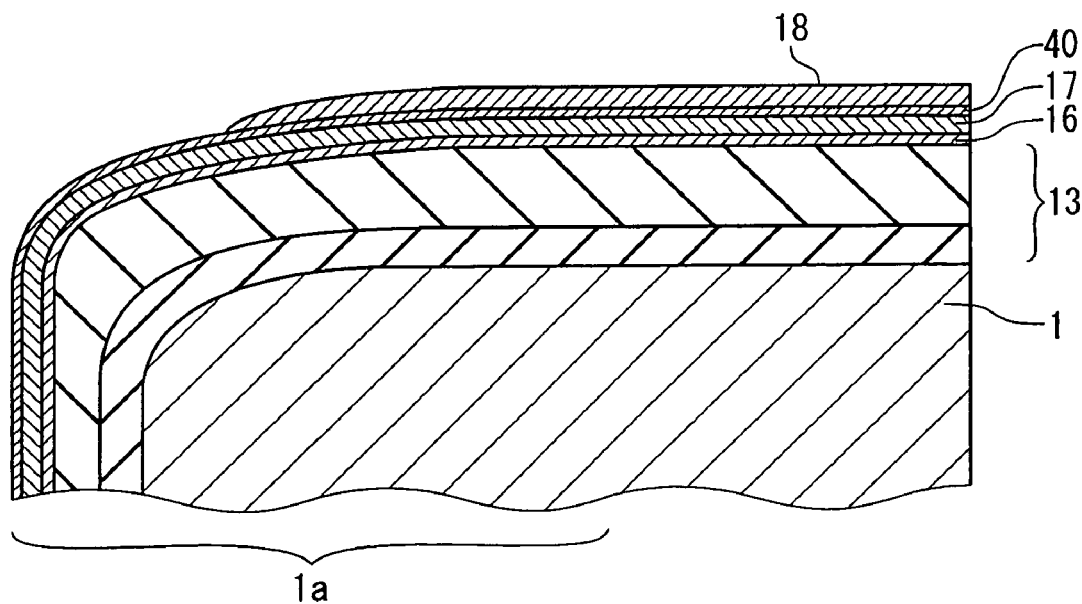
FIGS. 11A to 11D are cross-sectional views showing the peripheral edge part of the silicon wafer in the manufacturing process of the semiconductor substrate relating to the third embodiment of the present invention.

The lower electrode layer 18 has an edge-cut on the peripheral edge part 1a at a region located within 4 mm from the peripheral edge in a central direction, as shown in FIG. 11A.

If the lower electrode layer 18 on the peripheral edge part 1a has a thickness distribution for which peeling is likely, the lower electrode layer 18 must be removed from the peripheral edge part 1a. To achieve this, RIE using a photoresist pattern (not shown in the drawings) may be used to remove the lower electrode layer 18 from the peripheral edge part 1a.

Figure 11B:
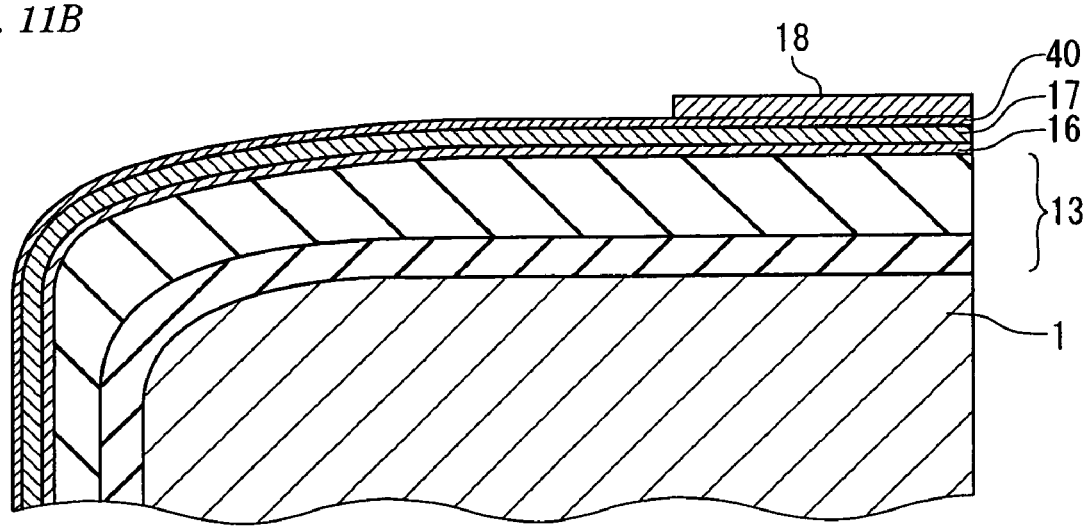

Note that when there is no risk of the edge-cut lower electrode layer 18 peeling from the peripheral edge part 1a, etching of the lower electrode layer 18 may not performed. As a result of the etching, the metal layer 40 under the lower electrode layer 18 on the peripheral edge part 1a of the silicon wafer 1 is in an exposed state, as shown in FIG. 11B.

Figure 11C:
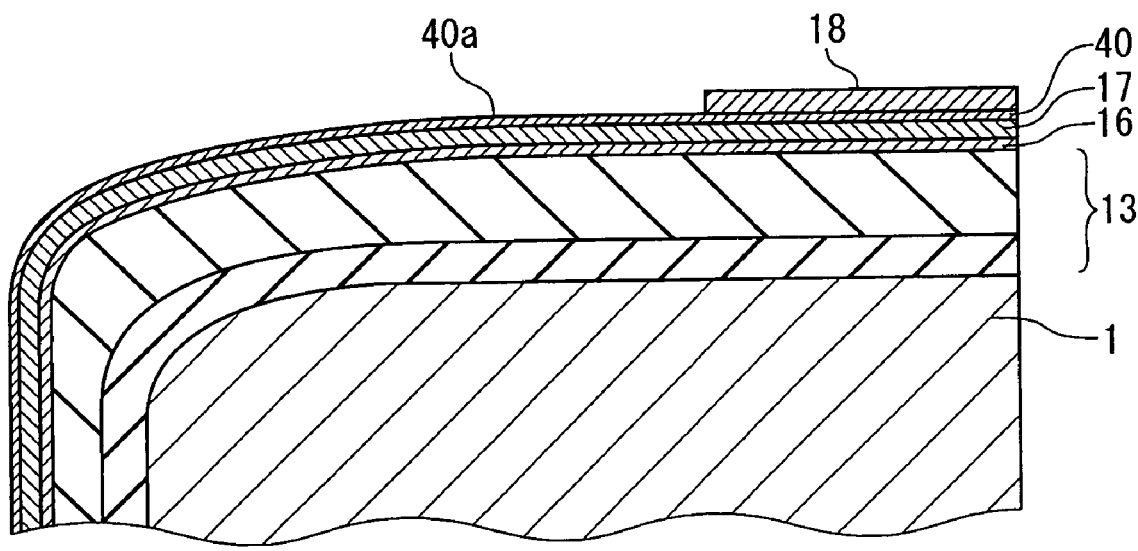

Next, the silicon wafer 1 is placed in an oven with an $O_2$ atmosphere, and the metal layer 40 exposed under the lower electrode layer 18 is oxidized at, for instance, 350 deg C. for 40 minutes as the oxidization conditions. As a result, the exposed portion of the metal layer 40 is oxidized to form the oxide layer 40a, as shown in FIG. 11C. When the metal layer 40 is aluminum, the oxide layer 40a is alumina; when the metal layer 40 is titanium, the oxide layer 40a is titanium oxide; and when the metal layer 40 is aluminum titanium the oxide layer 40a is aluminum titanium oxide.

Since the metal layer 40 is oxidized using a low temperature of, for instance, 350 deg C. the Ir composing the lower electrode layer 18 remains largely unoxidised, the surface orientation of the electrode layer 18 remains largely unchanged. The portion of metal layer 40 covered by the lower electrode layer 18 also remains unoxidized.

Figure 10B:
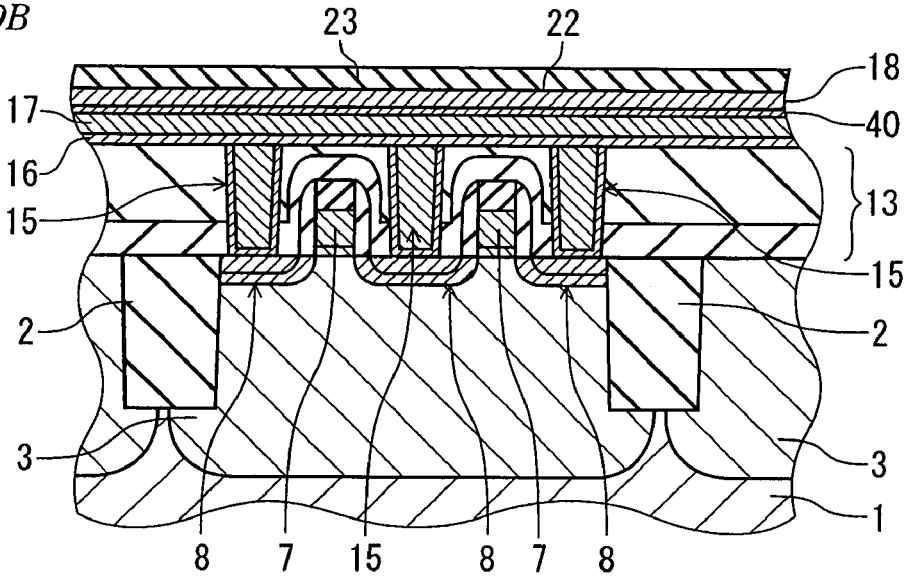
Figure 11D:
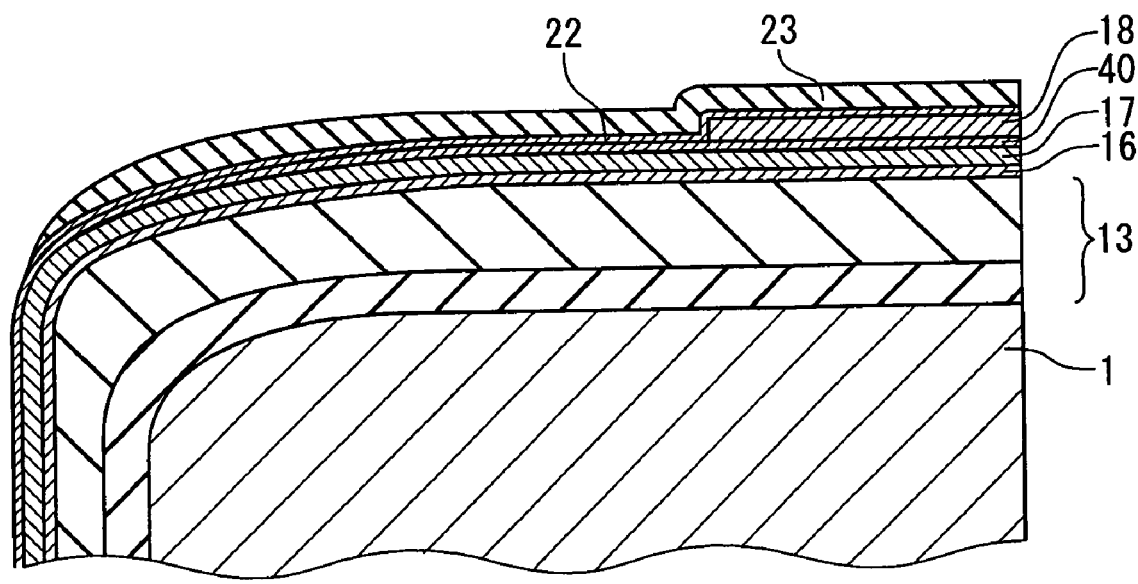

Next, as shown in FIG. 10B, the PZT layers 22 and 23 composed of Pb (Zr, Ti) are formed to cover the lower electrode layer 18 and the oxide layer 35. With this arrangement, at the peripheral edge part 1a of the silicon wafer 1, the first PZT layer 22 is formed directly on the oxide layer 40, and the second PZT layer 23 is formed on the first PZT layer 22, as shown in FIG. 11D.

Figure 10C:
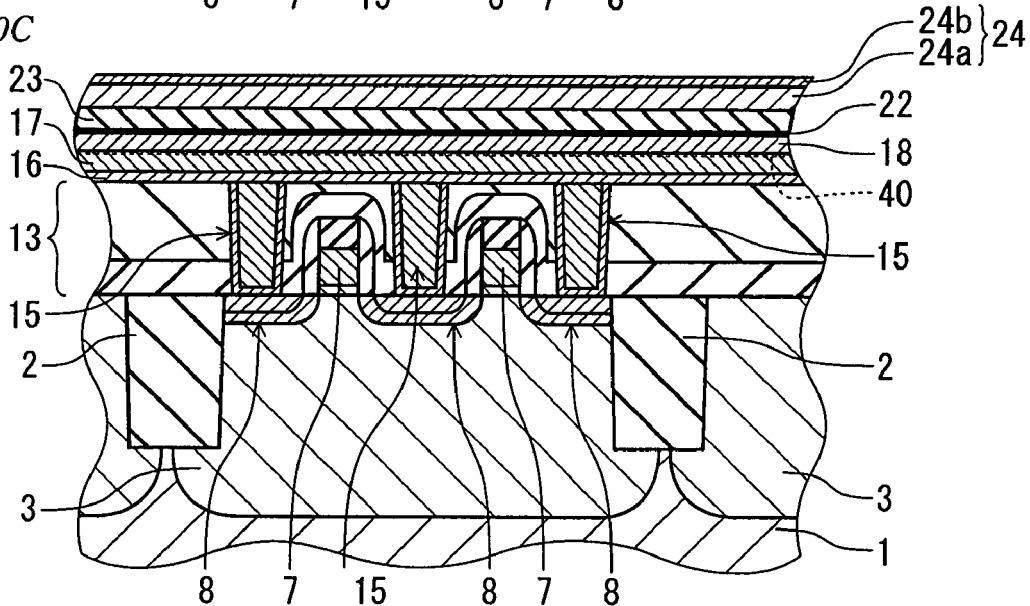

Next, an $IrO_2$ layer 24a and an Ir layer 24b are formed in the stated order on the second PZT layer 23. Together, the layers 24a and 24b form the upper electrode layer 24 shown in FIG. 10C.

Recovery annealing is then performed to eliminate the damage to the crystals of the PZT layers 22 and 23 caused by forming the upper electrode layer 24. For the recovery annealing, a method by which the silicon wafer 1 is placed in an annealing oven and heated for 60 minutes in a 550 deg C. atmosphere at atmospheric pressure while introducing oxygen may be used.

Under these conditions, the thin metal layer 40 under the lower electrode layer 18 fuses with the TiAlN barrier layer 17 to form a single body, with little of the thin metal layer remaining.

Figure 10D:
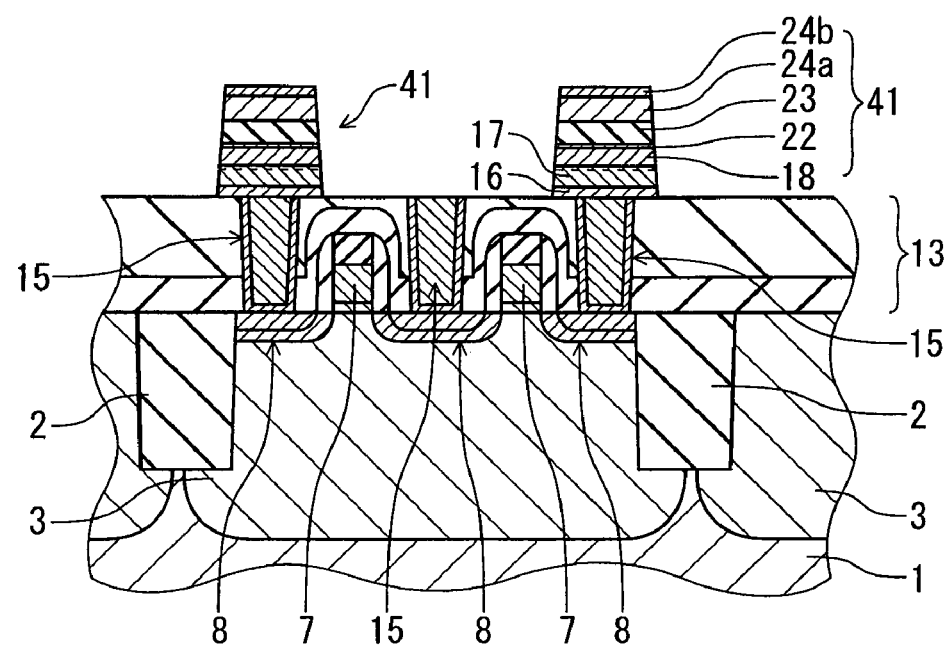

Next, the upper electrode 24, the PZT layers 22 and 23, the lower electrode 18, the metal layer 40, the TiAlN oxygen barrier layer 17, and the TiN layer 16 are patterned to form a ferroelectric capacitor 41 of the type shown in FIG. 10D. In this arrangement, the lower electrode layer 18 electrically connects to the source drain impurity infused region 8 on both sides of the P-well 3 via the metal layer 40, the TiAlN oxygen barrier layer 17, the TiN layer 16, and the first plug 15.

Note that the upper electrode layer 24, the PZT layers 22 and 23, the lower electrode layer 18, the oxide layer 40a, the TiAlN oxygen barrier layer 17 and the TiN layer 16 formed on the peripheral edge part 1a of the silicon wafer 1 may be etched away or allowed to remain.

Figure 10E:
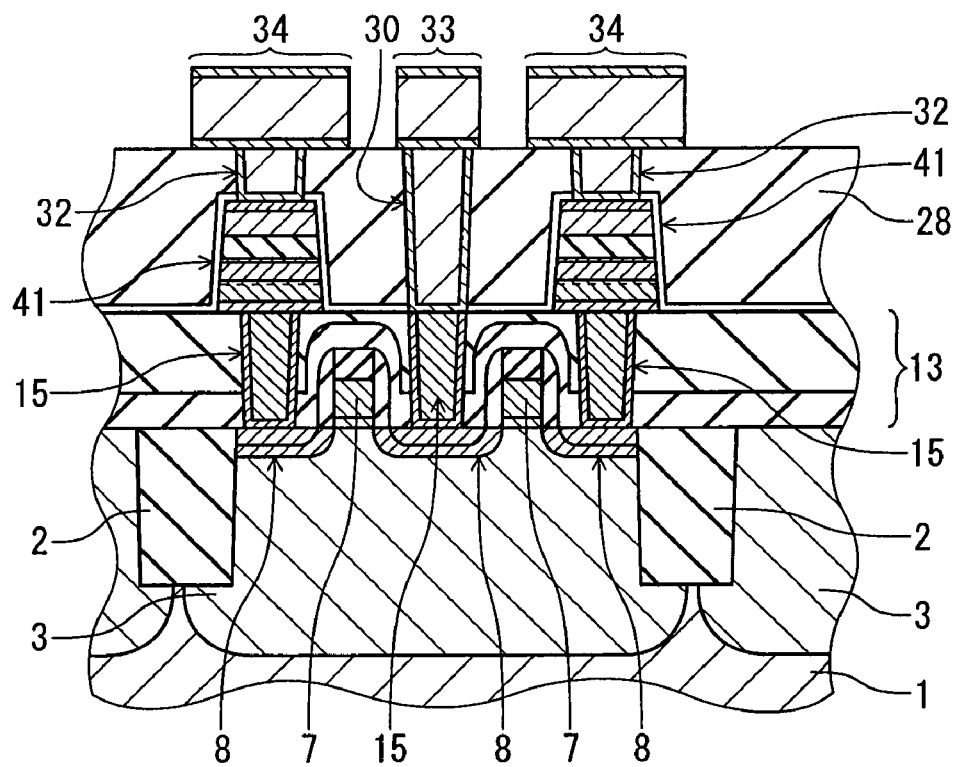

Next, the capacitor protecting film 27, which is an alumina layer, a PZT layer, or the like and covers the entire surface of the ferroelectric capacitor 41 and the first interlayer insulating layer 13, and the second interlayer insulating film 28 which covers the capacitor protecting film 27 are formed, as shown in FIG. 10E. After flattening the surface of the second interlayer insulating film 28 using a CMP method, the first via hole 29 and the second via holes 31 are formed over the first plug 15 in the center of the P-well 3 and over the ferroelectric capacitors 36, by partially etching the second interlayer insulating film 28 and the capacitor protecting film 27.

The second plug 30 and the third plugs 32 are then formed in the first via hole 29 and in the second via holes 31. The first wire 33 electrically connected to the source/drain impurity diffused region 8 via the first plug 15 at the center of the P-well and the second plug 30 above the first plug 15, the second wires 34 electrically connected to the upper electrode layers 24 on the ferroelectric capacitors 36 via the third plugs 32, and other wiring (not shown in the drawings) are then formed. Thereafter, multilayer wiring is formed, and the silicon wafer 1 is divided along scribe lines to form a plurality of FeRAM.

As described above, before the lower electrode layer 18 composed of Ir is formed, the entire surface of the TiAlN oxygen barrier layer 17, including the region on the peripheral edge part 1a of the silicon wafer 1 is covered with an easily oxidizable metal layer 40 such as aluminum, titanium, aluminum titanium or the like. Then, at the peripheral edge 1a of the silicon wafer 1, the exposed portion of the metal layer 40, which is not under the lower electrode layer 18, is oxidized to form an oxide layer 40a.

As a result, the oxide layer 40a prevents the PZT layers 22 and 23 from contacting the TiAlN oxygen barrier layer 17. Moreover, the oxide layer 40a adheres favorably to the TiAlN oxygen barrier layer 17 and to the PZT layers 22 and 23. Note also that the adhesiveness of the oxide layer 40a to the TiAlN oxygen barrier layer 17 is further improved by selecting, as the oxide for the oxide layer 40a, a material that includes an oxide of the elements in the TiAlN oxygen barrier layer 17, such as aluminum oxide or titanium oxide.

As a result, the PZT layers 22 and 23 do not peel from where the lower electrode layer 18 has been removed at the peripheral edge part 1a of the silicon wafer 1, and wafer contamination caused by film peeling is prevented.

The above embodiments describe stack type ferroelectric capacitors. However, in the case of planar-type ferroelectric capacitors, when an AlTiN layer or TiN layer is formed between the ferroelectric capacitor and the interlayer insulating film therebelow, an edge-cut may be generated in the lower electrode layer on the peripheral edge part of the silicon wafer and an oxide layer may be formed on the exposed portion of the AlTiN layer or TiN layer.

Moreover, the method for forming the ferroelectric film in the above-described embodiments is not limited to the MOCVD method, and alternatives include a sol-gel method, a sputter method, and a MOD (Metal Oxide Deposition) method. Also, besides PZT, PZT-type materials such as PLCSZT, PLZT; Bi layer-state compounds such as $SrBi_2Ta_2O_9$ and $SrBi_2(Ta, Nb)_2O_9$; or other metal oxide ferroelectric materials may be used. Also, when a high-dielectric capacitor is used, a high-dielectric oxide film of $Ba_z Sr_{1-x} TiO_3$, PLZT or the like is used in place of the ferroelectric.

The foregoing is considered as illustrative only of the principles of the present invention. Further, since a number modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device, comprising:
    forming an insulating film;
    forming a barrier layer containing a metal over the insulating film in a region including a peripheral edge part of a semiconductor substrate;
    forming a capacitor lower electrode layer on the barrier layer having an edge-cut on the peripheral edge of the semiconductor substrate;
    forming an oxide layer on the barrier layer at the peripheral edge part where the barrier layer is not covered by the lower electrode layer;
    forming a ferroelectric layer on the capacitor lower electrode layer and the oxide layer;
    forming a capacitor upper electrode layer over the ferroelectric layer; and
    dividing the semiconductor substrate,
    wherein the oxide layer is formed after forming the capacitor lower electrode layer by oxidizing the barrier layer at the peripheral edge part where the barrier layer is not covered by the lower electrode layer.

2. The method of manufacturing a semiconductor device according to claim 1, wherein
    the oxide layer includes the metal which composes the barrier layer.

3. The method of manufacturing a semiconductor device according to claim 1, further comprising:
    forming an oxidization preventing layer on the capacitor lower electric layer before oxidizing the barrier layer.

4. The method of manufacturing a semiconductor device according to claim 1, wherein
    the edge-cut is formed by etching the capacitor lower electrode layer with an oxidization preventing layer as a hard mask.

5. A method of manufacturing a semiconductor substrate, comprising:
    forming an insulating film;
    forming a barrier layer containing a metal over the insulating film in a region including a peripheral edge part of the semiconductor substrate;
    forming a capacitor lower electrode layer on the barrier layer having an edge-cut on the peripheral edge of the semiconductor substrate;
    forming an oxide layer on the barrier layer at the peripheral edge part where the barrier layer is not covered by the lower electrode layer;
    forming a ferroelectric layer on the capacitor lower electrode layer and the oxide layer; and
    forming a capacitor upper electrode layer over the ferroelectric layer,
    wherein the oxide layer is formed after the capacitor lower electrode layer by oxidizing the barrier layer at the peripheral edge part where the barrier layer is not covered by the lower electrode layer.

6. The method of manufacturing a semiconductor substrate according to claim 5, wherein
    the oxide layer includes the metal which composes the barrier layer.

7. The method of manufacturing a semiconductor substrate according to claim 5, further comprising:
    forming an oxidization preventing layer on the capacitor lower electric layer before oxidizing the barrier layer.

8. The method of manufacturing a semiconductor substrate according to claim 5, wherein
    the edge-cut is formed by etching the capacitor lower electrode layer with an oxidization preventing layer as a hard mask.

* * * * *